US012751286B2

(12) United States Patent
Dinh et al.

(10) Patent No.: US 12,751,286 B2

(45) Date of Patent: Sep. 29, 2026

(54) FinFET WITH LOCAL HEATSINKING AND METHOD OF MANUFACTURING THE SAME

(71) Applicant: NXP B.V., Eindhoven (NL)

(72) Inventors: Viet Thanh Dinh, Austin, TX (US); Asanga H Perera, West Lake Hills, TX (US); Sai-Wang Tam, Sunnyvale, CA (US)

(73) Assignee: NXP B.V., Eindhoven (NL)

(*) Notice: Subject to any disclaimer, the term of this patent is extended or adjusted under 35 U.S.C. 154(b) by 355 days.

(21) Appl. No.: 18/506,248

(22) Filed: Nov. 10, 2023

(65) Prior Publication Data

US 2025/0157872 A1 May 15, 2025

(51) Int. Cl.

| | |
|---|---|
| ***H01L 23/367*** | (2006.01) |
| ***H01L 29/66*** | (2006.01) |
| ***H01L 29/78*** | (2006.01) |
| ***H10D 30/01*** | (2025.01) |
| ***H10D 30/62*** | (2025.01) |
| ***H10W 40/22*** | (2026.01) |

(52) U.S. Cl.

CPC .......... *H10W 40/22* (2026.01); *H10D 30/024* (2025.01); *H10D 30/6211* (2025.01)

(58) Field of Classification Search

CPC ............................ H01L 23/367; H10W 40/22

See application file for complete search history.

(56) References Cited

U.S. PATENT DOCUMENTS

| | | | | |
|---|---|---|---|---|
| 9,716,086 | B1 * | 7/2017 | Cheng | H10D 89/611 |
| 10,714,469 | B2 | 7/2020 | Zhou | |
| 11,631,767 | B2 | 4/2023 | Zhou | |
| 12,587,144 | B2 | 3/2026 | Tam et al. | |
| 2021/0118994 | A1 * | 4/2021 | Tsai | H10D 30/6219 |

FOREIGN PATENT DOCUMENTS

| | | |
|---|---|---|
| CN | 107026084 A | 8/2017 |

OTHER PUBLICATIONS

European Patent Office, Written Opinion, EP Pat. App. No. 24211857.8, Apr. 23, 2025, all pages. (Year: 2025).*

(Continued)

*Primary Examiner* — Victoria K. Hall

(57) ABSTRACT

One example discloses a finFet semiconductor device and corresponding manufacturing method is disclosed, the device comprising: a substrate having therein a body-region, a plurality of elongate fins at a first major surface and within the body-region; an oxide layer on the first major surface and partially surrounding a lower portion of the elongate fins; a gate contact extending across and partially surrounding an upper portion of the plurality of elongate fins; a dielectric material, between the fins and the gate region; a plurality of elongate partial fins, parallel thereto and having a height which is less than a height thereof; an elongate metal contact, extending into the substrate and in electrical contact with the partial fins, and forming a body-contact; wherein the elongate metal contact extends between the two of the elongate partial fins and below an upper surface thereof and fills a space therebetween.

19 Claims, 19 Drawing Sheets

(56) References Cited

OTHER PUBLICATIONS

European Patent Office, Search Report, EP Pat. App. No. 24211857.8, Apr. 23, 2025, all pages. (Year: 2025).*

Prasad, Divya et al.; "Buried Power Rails and Back-side Power Grids: ARM CPU Power Delivery Network Design Beyond 5nm"; 2019 IEEE International Electron Devices Meeting; Dec. 2019; pp. 446-449.

Liu, S.L. et al.; "Self-Heating Temperature Behavior Analysis for DC—GHz Design Optimization in Advanced FinFETs"; 2019 Symposium on VLSI Technology Digest of Technical Papers; 2 pages; Jun. 2019.

* cited by examiner

FinFET WITH LOCAL HEATSINKING AND METHOD OF MANUFACTURING THE SAME

FIELD

The present disclosure relates to FinFETs.

BACKGROUND

A FinFET is a topological configuration of a Field Effect Transistor (FET) in which a channel between the source and drain includes an elevated structure or “fin”, and the gate is wrapped around typically three surfaces of the fin. Such a structure can provide high values for channel widths, corresponding generally to approximately twice the height of the fin plus its width, whilst still allowing for relatively short gate lengths.

FinFETs are becoming of increasing significance for both high frequency and high power devices. Along with other three-dimensional topologies, the problem of self-heating of the device is particularly significant in finFETs, since the primary path for heat dissipation is through the substrate and heat from the transistor to the substrate flows through the narrow silicon fins, and the three-dimensional nature of the device impedes this path.

Conventional finFETs rely on techniques such as introducing gate dummies or other metal dummies around the heat source, however this may result in an increase in parasitic capacitance, and increase the area of the device.

SUMMARY

According to a first aspect of the present disclosure, there is provided a finFet semiconductor device, comprising: a substrate having therein a body-region, a plurality of elongate fins at a first major surface of the substrate and within the body-region; an oxide layer on the first major surface and partially surrounding a lower portion of the elongate fins; a gate contact extending across and partially surrounding an upper portion of the plurality of elongate fins; a dielectric material, between the fins and the gate region and providing galvanic isolation therebetween; a plurality of elongate partial fins, parallel to the plurality of elongate fins, and having a height which is less than a height of the plurality of elongate fins; and an elongate metal contact, extending into the substrate and in electrical contact with the plurality of elongate partial fins, and forming a body-contact for the finFET; wherein the elongate metal contact extends between a two of the plurality of elongate partial fins and below an upper surface thereof and fills a space therebetween. By replacing the material between the partial fins, which is typically a dielectric such as an oxide having a low thermal conductivity, with a metal having a high thermal conductivity, the heat-sinking of the active regions of the device may be improved, thereby lowering the operating temperature of the device.

In one or more embodiments, the finFET semiconductor device further comprises at least one elongate stump between the two of the plurality of elongate partial fins; wherein the elongate metal contact extends between the two of the plurality of elongate partial fins to the at least one elongate stump. Removing one or more of the partial fins and replacing it or them with metal having a relatively higher thermal conductivity may further improve heat flow away from the active part of the device. Although in other embodiments, the two of the plurality of elongate partial fins may be an adjacent two elongate partial fins, embodiments in which they are non-adjacent, but have elongate stumps therebetween may allow for a higher conductance into the substrate, and may help prevent the epitaxial silicon (or SiGe) from sealing over any gap between two adjacent partial fins, in embodiment which do not include a stump therebetween. In yet other embodiments, there may be more than two elongate partial fins having metal contact therebetween.

In one or more embodiments, a surface of the plurality of elongate partial fins, and a surface of the at least one elongate stump comprises a metal silicide. The skilled person will appreciate that metal silicide provides good electrical and thermal connection between the metal layers and the elongate partial fins.

In one or more embodiments, the elongate metal contact comprises a first seed metal in contact with metal silicide and a second metal, elsewhere. Use of the seed metal may be beneficial in ensuring good adhesion and avoiding voids or micro voids within the device.

In one or more embodiments, the finFET semiconductor device, wherein the body-region has a first conductivity type, further comprises an elongate drain region, of a second conductivity type opposite the first conductivity type, extending across and in electrical connection with the plurality of elongate fins.

In one or more such embodiments, the elongate drain region is one of a plurality of such drain regions, the plurality of the elongate drain regions is of a plurality of such drain regions, and the gate contact is one of a plurality of such gate contacts, arranged as a sequence of separated regions in a drain-gate-source-gate-drain-gate-source configuration. Use of multiple fingers arranged interleaved between sources and drains, with gates therebetween, may increase the gate width of the device and may be beneficial for increasing the power capacity of the device.

In one or more embodiments, the elongate metal contact is adjacent but spaced apart from an outermost one of the sequence. This may be a particularly convenient positioning of a metal-to-substrate body contact.

In one or more embodiments the finFET semiconductor device, wherein the body-region has a first conductivity type, further comprises an elongate source region, of a second conductivity type opposite the first conductivity type, extending across and in electrical connection with the plurality of elongate fins.

In one or more embodiments, the finFETS device further comprises a stack of metal connection layers, having interlayer dielectric layers therebetween, wherein the elongate metal contact extends upwardly through a lowermost two of the interlayer dielectric layers.

In one or more embodiments, the body contact for the finFET is electrically connected to a source of the finFET, and the elongate metal contact forms a source contact for the finFET. Co-location of the body contact and source contact may allow for a more compact device design, or provide improved electrical stability across multiple circuits.

According to a second aspect of the present disclosure, there is provided a method of manufacturing a finFET device, the method comprising: providing a substrate having therein a body-region of a first conductivity type, and having a plurality of elongate fins at a first major surface of the substrate and within the body-region; providing an oxide on the first major surface and partially surrounding a lower portion of the elongate fins; providing a gate contact extending across and partially surrounding the plurality of elongate fins; providing a dielectric material, between the fins and the gate region and providing galvanic isolation therebetween;

etching a subset of the elongate fins to form a plurality of elongate partial fins, having a height which is less than a height of the plurality of elongate fins, and an upper surface at a same height as an upper surface of the oxide layer; removing the oxide layer between a two of the plurality of elongate partial fins; and depositing an elongate metal contact, extending into the substrate and in electrical contact with the plurality of elongate partial fins, to form a body-contact for the finFET, wherein the elongate metal contact extends between the two of the plurality of elongate partial fins and below an upper surface thereof and fills a space therebetween.

In one or more embodiments, the method further comprises etching a subset of the plurality of elongate partial fins between the two of the plurality of elongate partial fins, to form at least one elongate stump; and wherein the elongate metal contact extends between the two of the plurality of elongate partial fins to the at least one elongate stump.

In one or more embodiments, the method further comprises forming a metal silicide at a surface of the plurality of elongate partial fins, and a surface of the at least one elongate stump.

In one or more embodiments, the method further comprises depositing the elongate metal contact as first seed metal in contact with metal silicide and a second metal, elsewhere.

In one or more embodiments, the method further comprises forming elongate drain region, of a second conductivity type opposite the first conductivity type, extending across and in electrical connection with the plurality of elongate fins.

In one or more embodiments, the method further comprises forming an elongate source region, of a second conductivity type opposite the first conductivity type, extending across and in electrical connection with the plurality of elongate fins.

In one or more such embodiments, the elongate drain region is one of a plurality of such drain regions, the plurality of the elongate drain regions is of a plurality of such drain regions, and the gate contact is one of a plurality of such gate contacts, arranged as a sequence of separated regions in a drain-gate-source-gate-drain-gate-source configuration.

In one or more embodiments, the elongate metal contact is adjacent but spaced apart from an outermost one of the sequence.

In one or more embodiments, the method further comprises forming a stack of metal connection layers, having interlayer dielectric layers therebetween, wherein the elongate metal contact extends upwardly through a lowermost two of the interlayer dielectric layers.

These and other aspects of the invention will be apparent from, and elucidated with reference to, the embodiments described hereinafter.

BRIEF DESCRIPTION OF DRAWINGS

Embodiments will be described, by way of example only, with reference to the drawings, in which.

DETAILED DESCRIPTION OF EMBODIMENTS

Figure 1A:
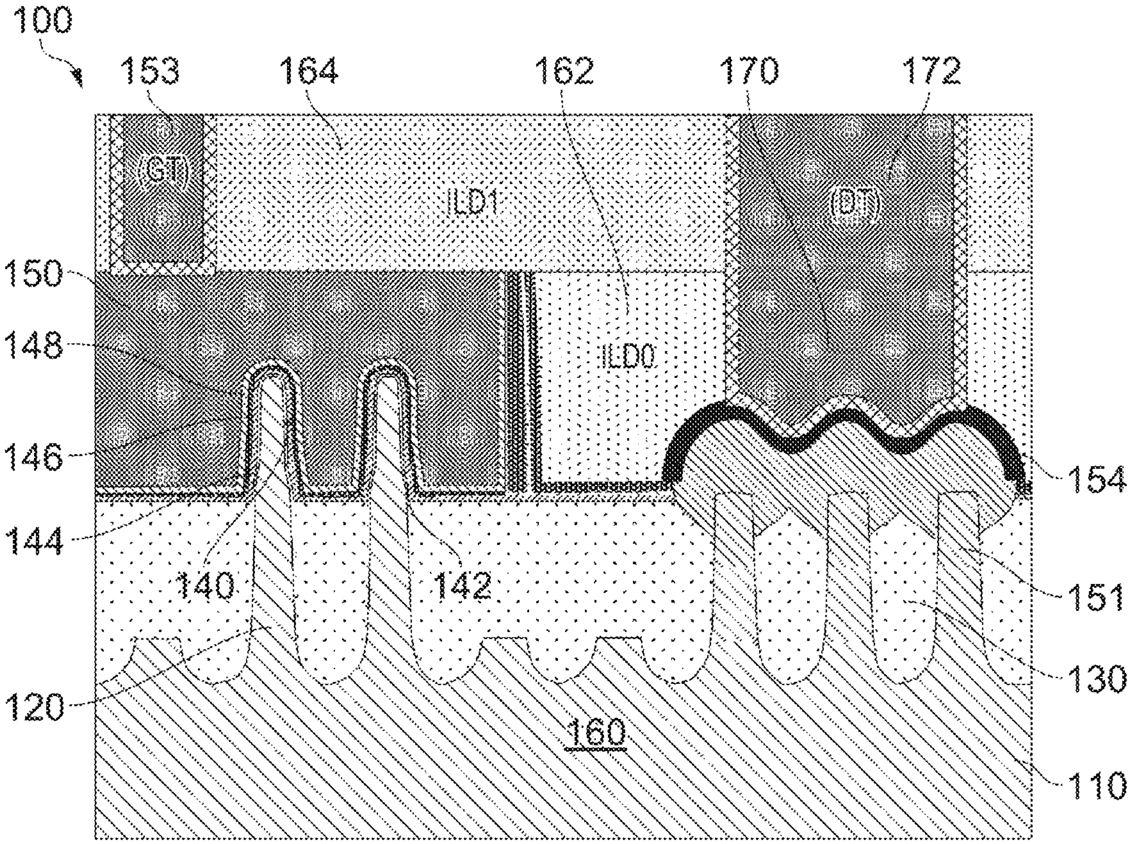
FIG. 1A (PRIOR ART)
FIGS. 1A, 1B illustrate, schematically, a cross-section through part of a finFET device including a metal trench to substrate according to embodiments of the present disclosure.
Figure 1B:
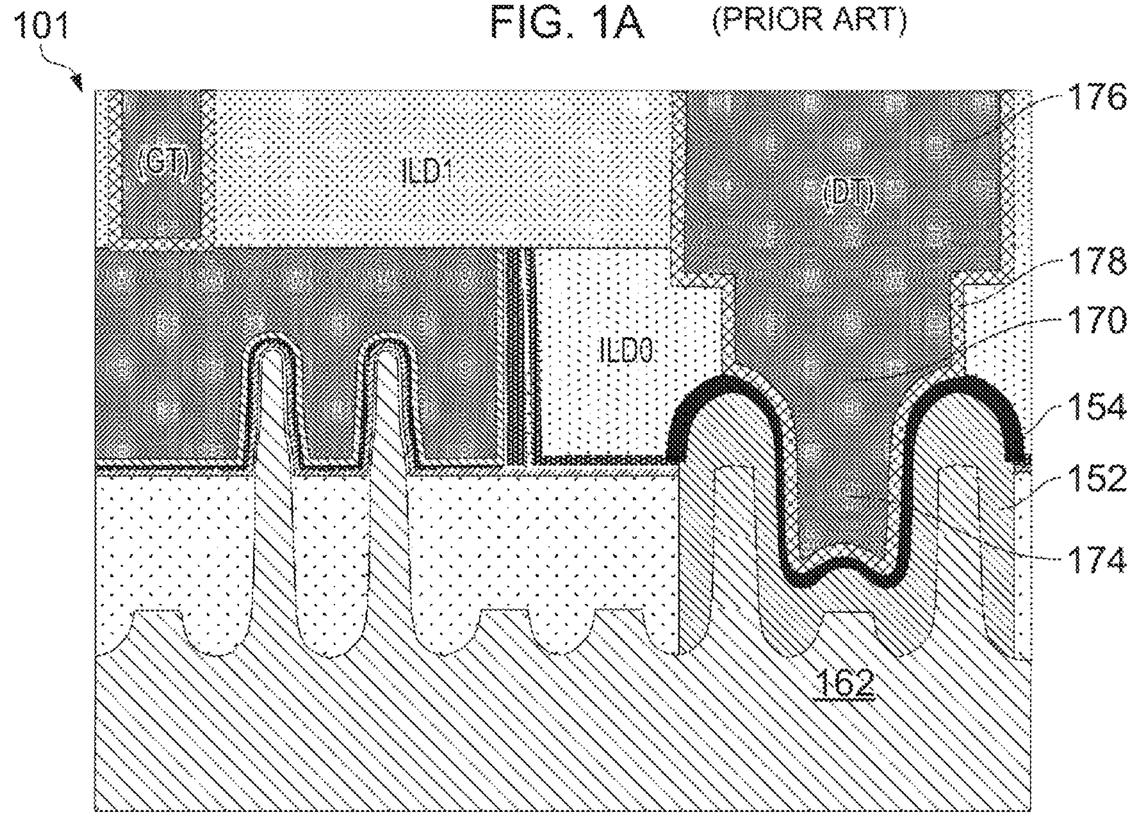

FIG. 1A shows a schematic cross-section, orthogonal to the direction of the fins, through part of a conventional finFET 100. FinFET 100 includes a substrate, which has therein adjacent to a first major surface a well 110 of a first conductivity type. For the sake of definiteness and without restriction, the well will be considered to be a N-type well, which may also be referred to as a N-well. The N-well has formed therein a plurality of elongate fins 120. The fins protrude above a surface of the substrate. Typically the fins are defined, as will be discussed in more detail hereinbelow, by providing a patterned mask on the top of the substrate, and etching into the substrate material, thereby removing material between the fins and leaving the fins protruding above the newly defined surface. In FIG. 1A the fins extend into the paper. Two such fins are shown. In the spaces between the fins and surrounding the fins, there is an oxide layer as shown, which is generally referred to as a field oxide 130. The fins protrude over the surface of the field oxide. The protruding part of the fins are covered by a dielectric 140, which may typically comprise a stack of dielectric layers, including a grown thermal oxide 142, and a high-k dielectric 144. The protruding part of the fins are covered by a barrier metal 146, a work function metal 148 and a gate electrode metal 150. The dielectric 140 separates the fins from the gate electrode metal 150 and a metal track ("GT") 153. The gate metal stack composed of the barrier metal 146, a work-function metal 148 and a gate electrode metal 150, may, alternatively, be formed using polysilicon. The gate may be electrically connected to the exterior of the device through a multilayer stack of metal tracks isolated from each other, the layers being separated by interlayer dielectrics (ILD). FIG. 1B shows a lowermost ILD, ILD0 162 and first ILD, ILD1 164, although skilled person will recognise that in a typical device there may be between five and fifteen such metal layers in the stack.

Although the cross-section in FIG. 1A shows the location of the gate, further into the paper and thus not shown, a drain similarly crosses and surrounds, and is in contact with, the fins. The drain, which may also be referred to as a drain finger, is electrically connected directly to the fins and thus is not separated by the dielectric 140. Moreover, and also not shown, the device includes a source, which also crosses and surrounds, and is in contact with, the fins. The source, which may also be referred to as a source finger, is also in direct electrical contact with the fins and thus not separated by the dielectric 140. A typical device has a plurality of source and drain regions or fingers, and these are arranged spaced apart with a plurality of gates, in (extending in out of the paper) a sequence drain-gate-source-gate-drain-gate . . . and so on. As will be familiar to the skilled person, electrical connections are provided to the source and drain, and the channel therebetween is formed of the fins. The electrical "gate length" parameter is thus defined by the width of the physical gate contact (into the paper) and the electrical "gate width" parameter is defined by (twice) the height of the fin and its width. Since large gate widths are thereby achievable, such finFETs can operate as high power devices.

Also shown in FIG. 1A is a conventional body contact: as shown, the device includes a plurality of partial fins 151. These correspond to fins which have been partially etched so their top surface is approximately coplanar with the surface of the field oxide 130. The partial fins 151 are spaced apart from the plurality of fins 120, and separated therefrom by one or more stumps 160. Each stump 160 correspond to a fin which has been completely, or substantially etched to its bottom. The gaps between the partial fins are filled with field oxide 130. The fins are within the N-well and generally have the same doping level as the remainder of the N-well. However, the partial fins are provided in order to make an electrical connection to the n well itself (typically referred to as the body contact). In order to lower the resistivity of that electrical contact, the upper portions of the partial fins are implanted (as will be discussed in more detail hereinbelow) with further n-type dopant and thereafter annealed in order to increase their conductivity. The resulting n+ upper surfaces of the partial fins are electrically connected to a contact metal 170. Which is connected to the outside world through the metal stack. Shown is the metal track ("DT") 172 through the first level interlayer dielectric (ILD1).

As already discussed in introduction, self-heating is a problem for high-power finFETs, and the problem is exacerbated with increasing miniaturisation. It becomes an increasing challenge for smaller manufacturing "nodes", such as 16 nm, 14 nm, 12 nm 10 nm, 7 nm, 6 nm, 5 nm, 4 nm and 3 nm.

Figure 2A:
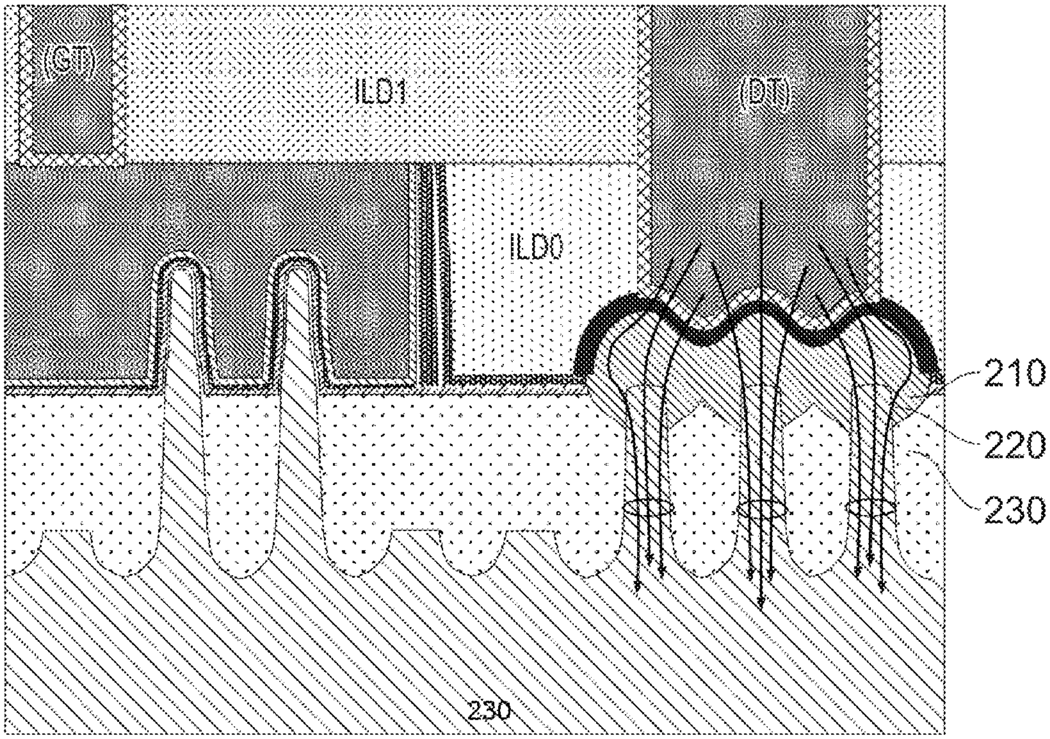
FIG. 2A (PRIOR ART)
FIG. 2A illustrates heat dissipation flows through a contact in a conventional finFET.

Turning forward to FIG. 2A, this shows the typical heat path for a finFET as shown in FIG. 1*a*. Metal layers provide a high thermal conductivity, and thus are efficient at directing heat away from the active part of the device. However, the effectiveness of heat-sinking to the substrate is limited by the device structure. In particular, the source, drain or body contact (metal or polysilicon) extends down to the field oxide, which as well as being an electrical insulator is also a good thermal insulator. Very little heat can be conducted away through the interface 210. Heat is thus channelled, as shown by the arrows 220 to the tips 230 of the partial fins, and funnelled through the partial fins.

According to embodiments of the present disclosure, there is provided a finFET structure, together with a manufacturing of the same, which may overcome or alleviate the channelling or funnelling of the heat, and thus may improve the cooling of the device.

FIG. 1B shows a schematic cross-section, orthogonal to the direction of the fins, through part of a finFET 101 according to one or more embodiments of the present disclosure. The structure of the parts of the device associated with the fins and gate are the same or similar to those described above, and so will not be the described in detail. However, the body contact region of the device is different. Body contact 170 includes a trench 174 which extends between partial fins 151 and into the substrate. Although a trench could be provided between adjacent partial fins, their spacing is generally relatively close, at approximately 10 to 20 nm at the base of the partial fins. The volume of metal included in the trench may be increased by removing (typically by etching as will be discussed in more detail hereinbelow) one or more of the fins between the partial fins to leave just stumps 162. Compared with the conventional device shown in FIG. 1A, the body contact extends further into the silicon substrate. Moreover, compared with the conventional device shown in FIG. 1A, the metal track 176 in ILD1, which forms part of the electrical connection between of the body contact the outside world, may be wider. Moreover, the partial fins, and stump, which is in electrical contact with the metal body contact layer 174 may have at its outer surface an epitaxial layer 152 which may typically be silicon or SiC, and further may include of layer of metal silicide 154. As will be described in more detail hereinbelow, the silicidation of the partial fins and stumps may take place during and simultaneously with an existing process step. Furthermore, the body contact metal may include a seed metal layer 178. The seed metal may have a thickness of typically between 2 and 5 nm.

Figure 2B:
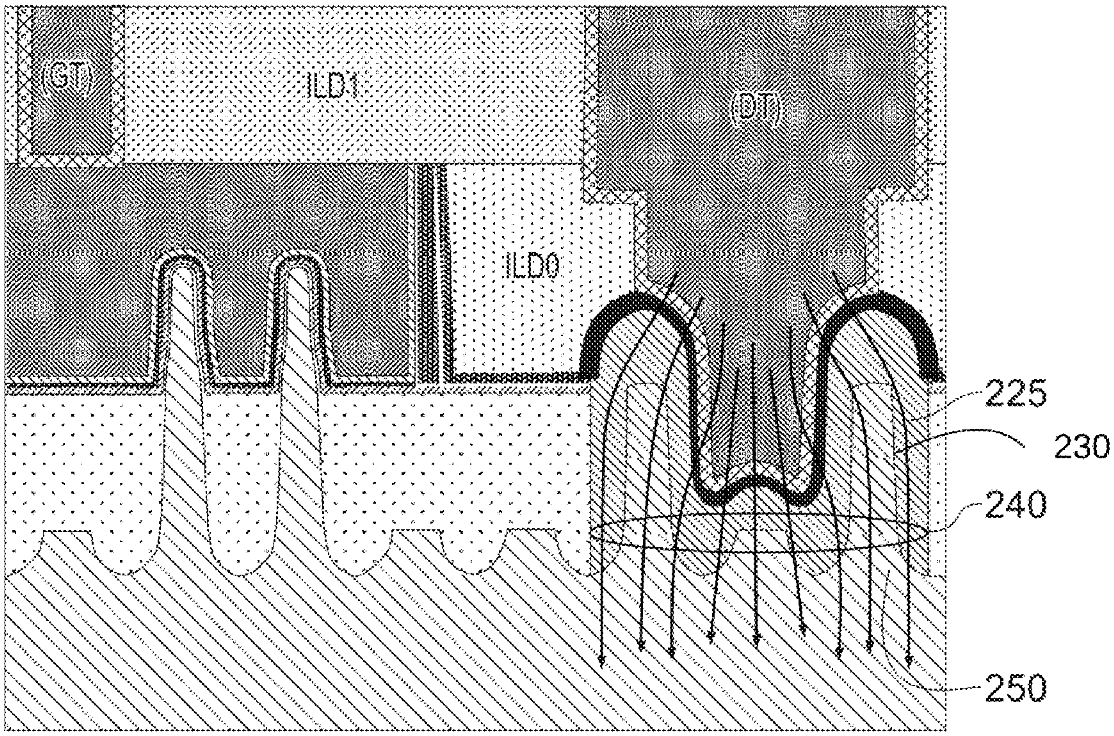
FIG. 2B illustrates heat dissipation flows through a contact according to embodiments of the present disclosure.

Turning now to FIG. 2B, this shows a typical heat path for a finFET as shown in FIG. 1B. Compared with the heat flow for a conventional structure, it is apparent from the arrows 225 that heat may flow directly from the metal body contact to not only the tips 230 of the partial fingers, but directly into the substrate area over the relatively large area of the interface between the body contact and the silicon, not only of the side surfaces 240 of the partial fins but also of the stump or stumps 250 and spaces therebetween. Furthermore, the skilled person will appreciate that by using the body contact as a metallic heatsink to the substrate, there is little or no increase in device area or so-called "silicon real estate". Improved thermal performance may therefore be provided without the increased cost associated with dedicated heatsinking structures, or additional gates or dummy metals as has been proposed elsewhere, which adds parasitic capacitances, which are generally undesired and may be critical for high-performance high-frequency applications.

Figure 3A:
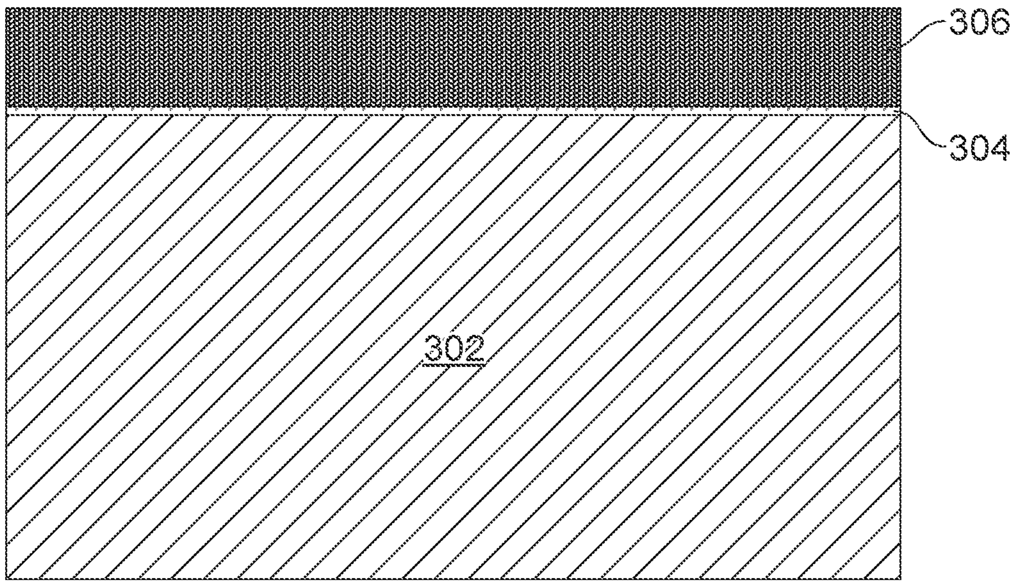
FIGS. 3A to 3X, show schematic cross-section through part of a finFET device according to embodiments of the present disclosure, at various stages of manufacture.

A typical process flow for a finFET according to embodiments of the present disclosure will now be described with reference to FIG. 3A to FIG. 3X.

N-Well and P-Well Implantation.

In a first stage of manufacture, N Wells and P Wells are implanted into the silicon base layer. The silicon base layer may be a silicon substrate or may comprise an epitaxial layer over an oxide layer for silicon-on-is insulator (SOI) or buried oxide (BOX) devices. FIG. 3A shows a cross-section of a completed device in which a p-well 302 is visible.

Pad Oxide Growth

In a next stage of manufacture, an oxide layer 304, which is commonly known as a pad oxide, is grown across the surface of the device. The oxide may be of the order of 5 to 25 nm, and is typically approximately 10 nm, thick.

Low Stress Nitride Deposition.

In a next stage of manufacture, a nitride layer 306 is deposited on the pad oxide. The nitride may be pure silicon nitride or a silicon oxynitride and is conventionally referred to as a low stress nitride. The nitride layer typically has a thickness in a range between 200 and 600 nm, and may be approximately 400 nm thick. FIG. 3A shows a schematic cross-section through a finFET device according to embodiments of the present disclosure, after these steps of manufacture.

Fin Lithography

A next stage of manufacture is Fin formation. In order to provide relatively narrow fins, a range of different lithography-based processes may be used. One such process is "Self-Aligned-Double-Patterning" or SADP.

Fabricate Etch Mask

A next stage of manufacture is fabrication of an etch mask 308. The etch mask may be the patterned with photoresist resulting from the fin photolithography, or may, more typically, be a hard mask such as that defined by SADP.

Fin Silicon Etch

Figure 3B:
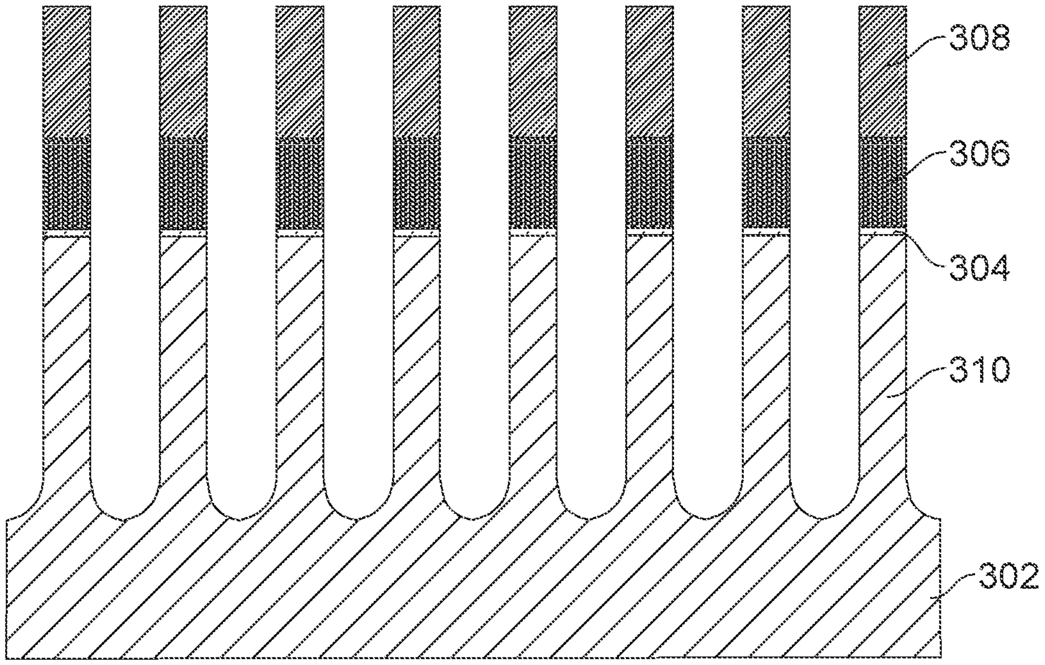

A next stage of manufacture is etching the unmasked areas of nitride, oxide, and silicon to form a plurality of silicon fins 310. The silicon fins typically have a width in the range of 5 to 30 nm, a height of 30 to 200 nm, and extend along the entire, or most of the, device (not shown in the Figures since this direction extends into the paper). FIG. 3B shows a schematic cross-section through a finFET device according to embodiments of the present disclosure, after these steps of manufacture.

Strip Etch Mask

A next stage of manufacture is stripping the etch mask. In embodiments into which the etch mask is a hard mask, this typically involves a wet etch which is selective against both the nitride and the silicon. In embodiments in which the etch mask is the photoresist, it may be readily removed by use of an appropriate solvent.

'Fin Removal' Lithography

Next, a further photolithography stage is performed, in which some of the fins are left unmasked.

Etch Silicon Fins in Locations as Defined by 'Fin Removal' Mask

Figure 3C:
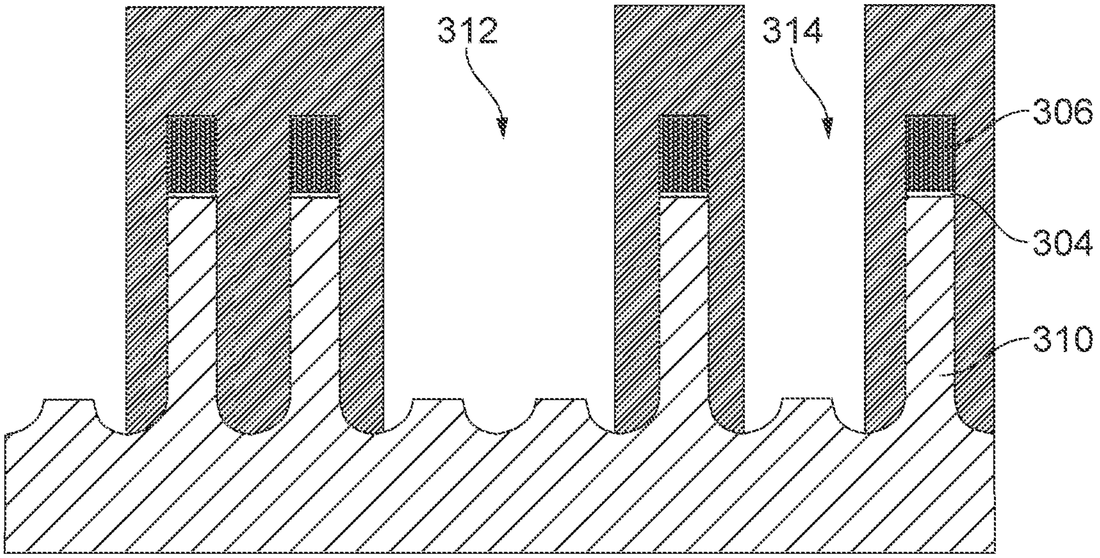

Next, the exposed fins are removed leaving gaps 312, 314 between group of fins. Whereas, as will be discussed in more detail hereinbelow, this stage is common to both conventional process flow and process flows according to embodiments of the invention, the photolithographic mask itself it is different from a conventional mask. In particular whereas in a conventional process flow groups of fins are removed in order to leave gaps 312 to isolate the different transistors, according to embodiments of the invention, additional fins are removed, as shown at 314, which will facilitate subsequent definition of metal trenches towards the silicon base layer, which as mentioned above is normally either the substrate or an epitaxial layer over an oxide. Gap 314 may be provided by a single removed fin as shown in FIG. 3C, or may comprise the space left by removal of a plurality of neighbouring fins. FIG. 3C shows a schematic cross-section through a finFET device according to embodiments of the present disclosure, after these steps of the manufacturing process.

Figure 3D:
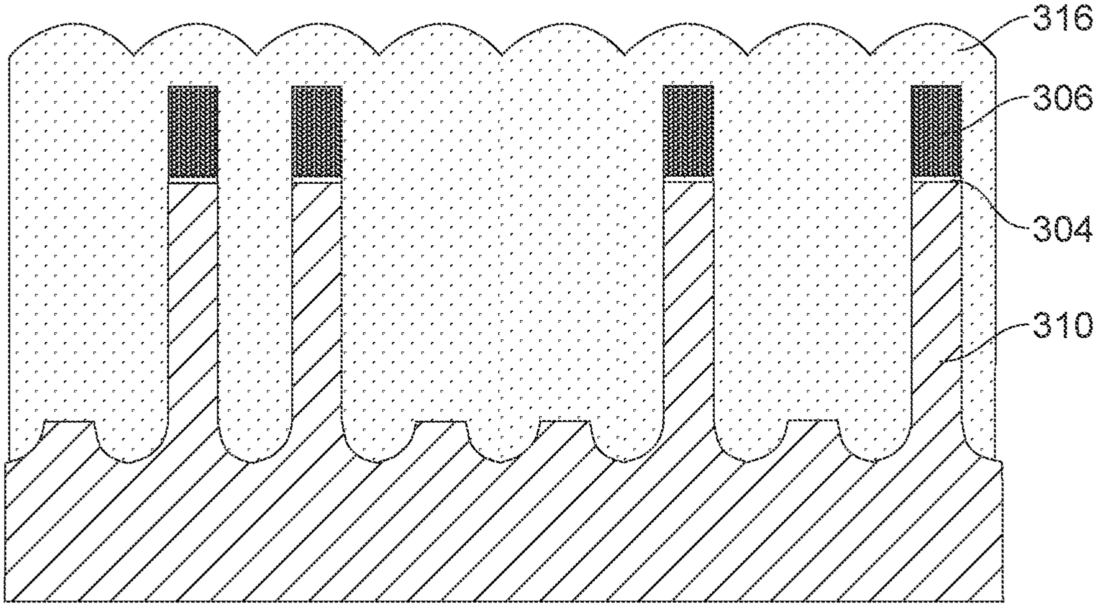

The skilled person will appreciate that, at least theoretically, the structure shown in FIG. 3D could be produced using only one lithography stage, in which the desired fins are protected and the fins which would conventionally be removed by the lithography stage shown in FIG. 3C are removed during the first, fin definition, lithography. However, the skilled person will appreciate that under using currently available lithographic techniques, the dimensions of the fins achievable are large relative to the dimensions of fins achievable by state of the art techniques such as self-aligned-double-patterning (SADP). The process stage to fabricate the fins is thus preferably separate from the lithography stage to remove unwanted fins.

Strip 'Fin Removal' Mask

In a next stage of the process, the fin removal mask is stripped.

Grow Silicon Oxide

In a next stage of the process, a silicon oxide layer is grown over the exposed base layer material including any residual stumps from the removed fins. This silicon oxide layer is typically shallow but sufficient to remove any surface layer from the silicon which may have been damaged by the etching process. Typically a layer between 5 and 10 nm in thickness is grown, sufficient for this purpose.

Deposit Oxide

In a next stage of the process, the photolithography mask is removed, and an oxide 316 is deposited. The oxide is typically referred to as a field oxide and may be deposited for instance starting from a TEOS precursor (tetra ethyl orthosilicate) precursor. FIG. 3D shows a schematic cross-section through a finFET device according to embodiments of the present disclosure, after these steps of the manufacturing process.

Chemical Mechanical Polish Oxide

Figure 3E:
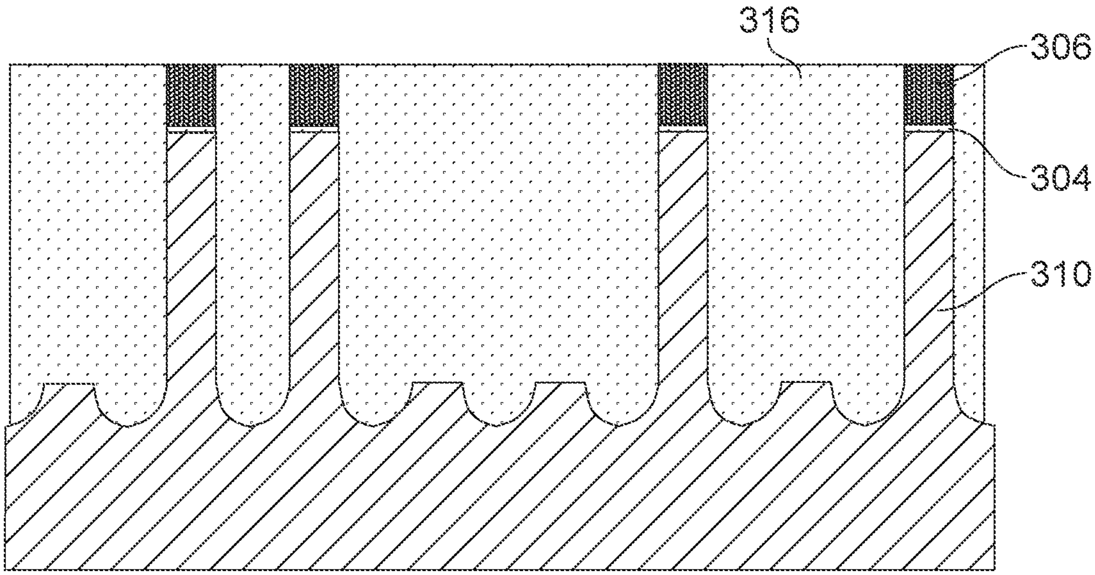

In a next stage of the process, the wafer is polished in a chemo-mechanical polishing, also referred to as Chemical Mechanical Polish" (CMP), in order to planarise the surface. The low stress nitride layer may be conveniently deployed as a "stop layer" in order to detect an endpoint of the CMP process. FIG. 3E shows a schematic cross-section through a finFET device according to embodiments of the present disclosure, after these steps of the manufacturing process.

Etch Oxide to Recess Field Oxide

In a next stage of the process, the field oxide is partially etched to recess it relative to the silicon fin such that a upper part 318 of each of the silicon fins is exposed above the recessed field oxide. An anisotropic etch, typically a dry etch is suitable for this process. Since the nitride 306 is still present on the top of each of the silicon fins, an etchant with low selectivity between silicon oxide and silicon itself may be used for this process. The nitride 306 acts as an etch stop.

Remove Low Stress Nitride

Figure 3F:
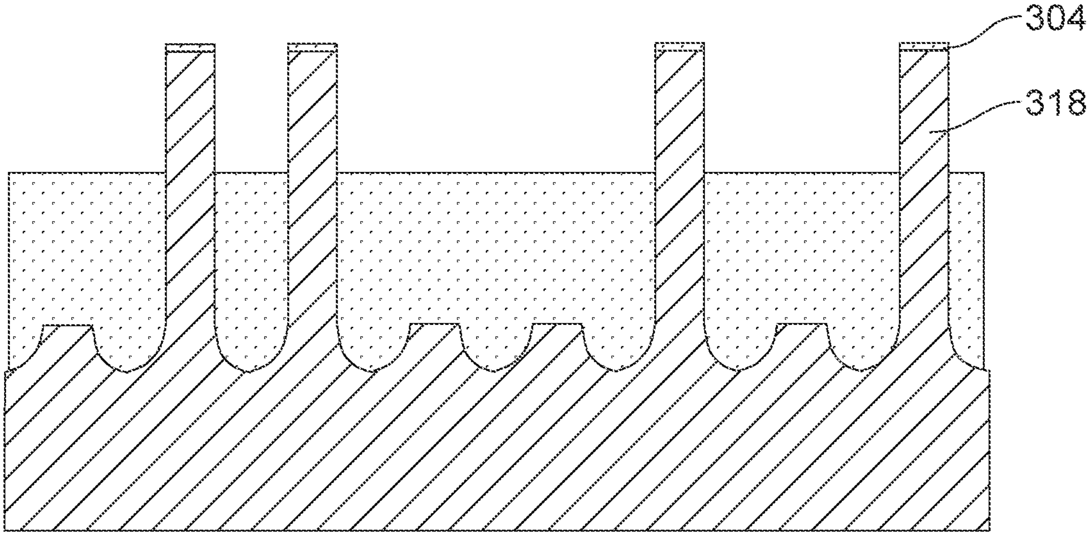

In a next stage of the process, the nitride is removed from over the top of the silicon fins. FIG. 3F shows a schematic cross-section through a finFET device according to embodiments of the present disclosure, after these steps of the manufacturing process.

Grow Thermal Oxide

Figure 3G:
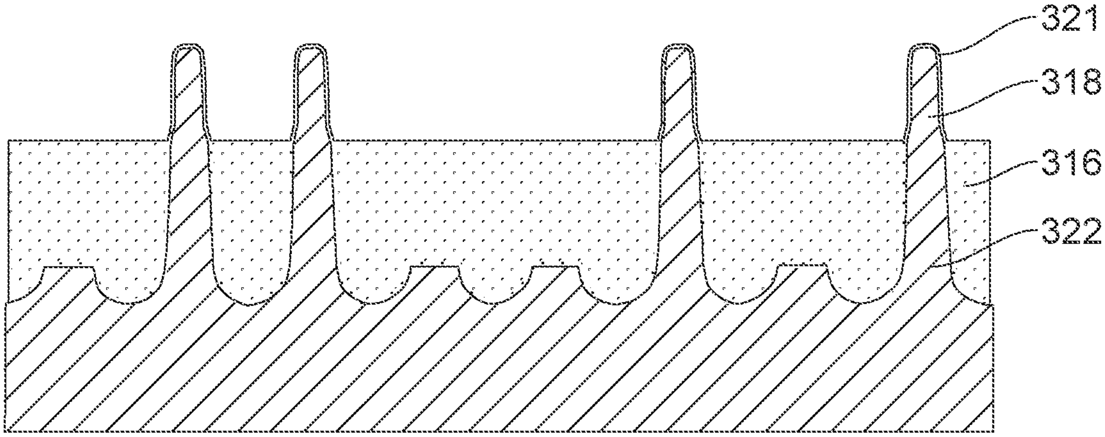

In a next stage of the process, an oxide layer 321 is grown over the exposed upper part of the silicon fins. This oxide layer is typically grown as a thermal oxide to allow for accurate control of the thickness. This oxide will function as a first layer of the gate dielectric in high voltage transistors (HV gate dielectric #1) according to this process. A suitable range of thickness for the oxide is between 4 and 10 nm and in particular the layer may be between 5 and 7 nm thick. As shown, the growth consumes part of the width of the thin fins such that the exposed upper part 318 (now encapsulated by the grown thermal oxide) is a few nanometres thinner than the lower part 322 which is embedded in the field oxide 316. FIG. 3G shows a schematic cross-section through a finFET device according to embodiments of the present disclosure, after these steps of the manufacturing process.

Etch the HV Transistor Gate Dielectric #1

In a next stage of the process, the thermally grown oxide layer is removed by etching from regions of the device where it is not required as the gate dielectric. This includes, for instance, parts of the device which are intended to subsequently become low voltage transistors and thus require a thinner gate oxide.

Pre-Clean Silicon Surface

In a next stage of the process, the silicon surface which has been exposed by the abovementioned etching process is PreCleaned.

Grow Thermal Oxide

In a next stage of the process, a thermal oxide 320 is grown which will act as a first layer of gate dielectric for low voltage transistors (LV gate dielectric #1). Control of the thickness and uniformity of this oxide is important for proper performance of the transistor and the oxide layer may be only a few atoms thick, having a thickness in a range of 5 to 25 Å and in typically within a range of 9 to 12 Å.

Deposit High-K Dielectric Layer

In a next stage of the process, a dielectric layer having a high permittivity (324) is deposited. In this context a high permittivity corresponds to one which is high relative to silicon dioxide. Whereas a range of values may be considered to correspond to a high permittivity, in practice any value of permittivity which is greater than 10 is suitable. The thickness of this layer is generally within a range of 1 to 10 nm and it may in particular be between 2 and 7 nm thick. This layer may be referred to as 'LV transistor Gate Dielectric #2'

Deposit Barrier Metal

In a next stage of the process, a barrier metal 326 is deposited across the device. The barrier metal is typically a refractory metal such as tungsten (W), tantalum (Ta) or titanium (Ti). Although the skilled person will appreciate that other suitable metals or alloy may be used instead, and embodiments are not limited to these particular metals.

Deposit Polysilicon

In a next stage of the process, a polysilicon layer 328 is deposited over the device. The poly silicon layer generally covers the complete device and has a thickness in a range between 50 nm and 200 nm, and may in particular be between 80 nm and 120 nm thick. The polysilicon may be referred to as a "(temporary) Transistor Gate" layer, since, as will be familiar to the skilled person, it will later be replaced by a metal gate.

Deposit Low-Stress Nitride

Figure 3H:
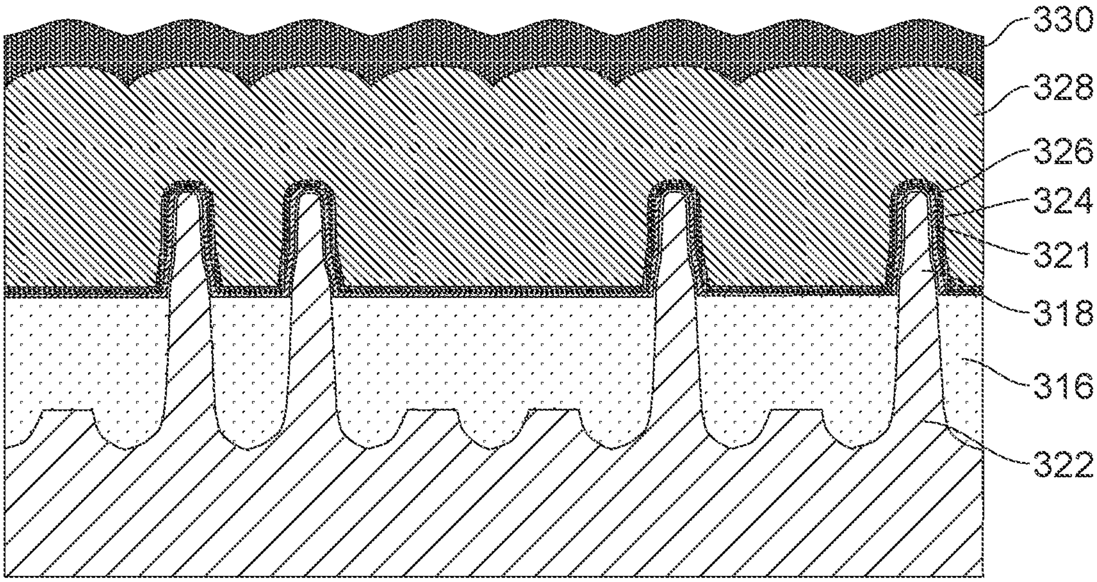

In a next stage of the process, a nitride layer 330 is deposited over the device. The nitride layer may be referred to as a "low stress" nitride. FIG. 3H shows a schematic cross-section through a finFET device according to embodiments of the present disclosure, after these steps of the manufacturing process.

Make Etch Mask

In a next stage of the process, an etch mask 332 is provided over the silicon fins (which will eventually provide the channels for the transistors). This mask may conveniently be a soft mask such as the photoresist of the photolithography stage itself.

Form Transistor Gate

Figure 3I:
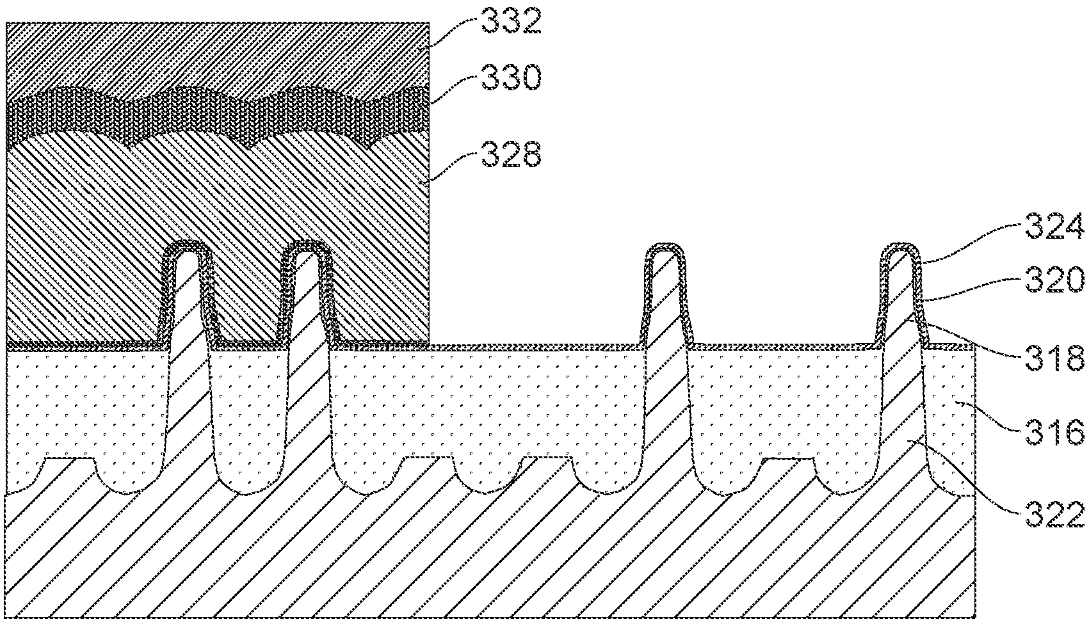

In a next stage of the process, the nitride 330 and poly silicon layer 328 are etched to form the transistor gates. FIG. 3I shows a schematic cross-section through a finFET device according to embodiments of the present disclosure, after these steps of the manufacturing process.

Remove Gate Etch Mask

In a next stage of the process, the etch mask is removed.

Deposit Oxide/Nitride Stack

In a next stage of the process, a stack of relatively thin layers of oxide 334 and nitride 336 are deposited. Each of the layers may typically be a few nanometres thick. These layers will subsequently be removed over most of the device to leave them as spacer layers.

Etch Oxide/Nitride Stack to Form Spacers

Figure 3J:
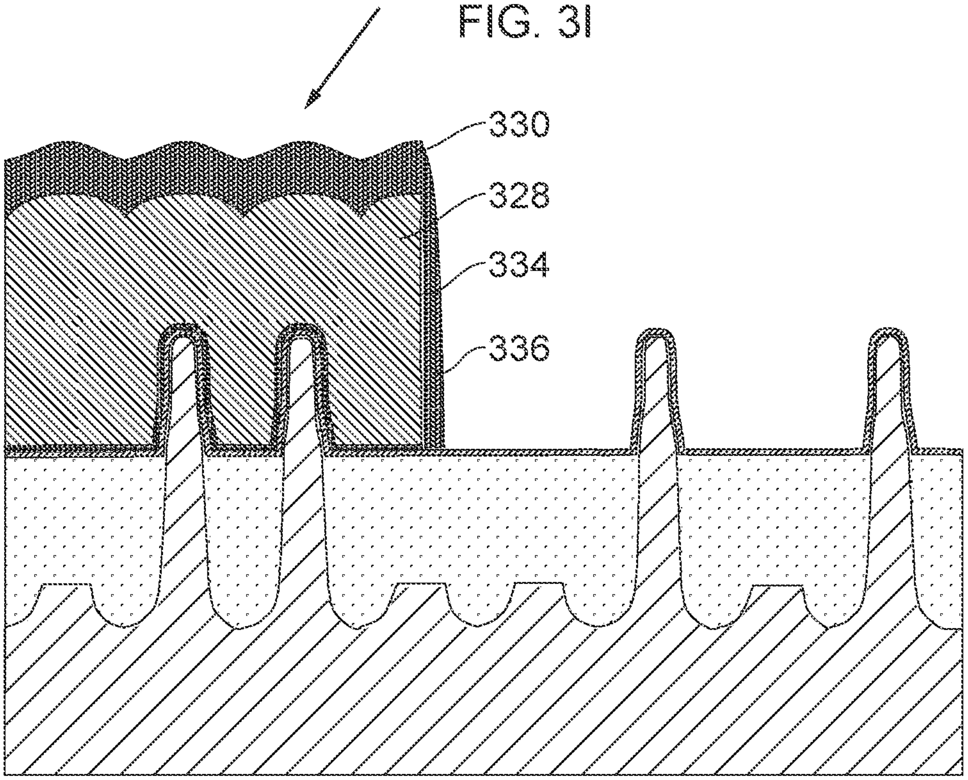

In a next stage of the process, the oxide and nitride stack is etched from most of the device. In particular, an anisotropic etch is used (typically in a dry etch process) in order to remove these layers from the exposed horizontal surface of the device and leave them only on the sidewalls of the transistor gate stack comprising polysilicon 328 and nitride 330. FIG. 3J shows a schematic cross-section through a finFET device according to embodiments of the present disclosure, after these steps of the manufacturing process. The skilled person will appreciate that although only a single oxide and single nitride layer are shown in FIG. 3J, in other embodiments there may be included multiple layers of oxide and nitride N & P Extension Implants In a next stage of the process, a photolithography stage is used to provide a patterned mask over the device, through which n-type dopant atoms are implanted in order to provide n-extension regions. These extension regions are part of the geometric layout of the device, and facilitate making appropriate electrical connection between the transistor channel and source-drain regions. Similarly, another photolithography stage is used to provide a further patterned mask over the device, through which p-type dopant atoms are implanted in order to provide p-extension regions.

N and P Source-Drain Implants (Masked)

In a next stage of the process, a photolithography stage is used to provide a patterned mask over the device, through which n-type dopant atoms are implanted in order to provide n+ source 338 and drain (not shown) regions. Similarly, another photolithography stage is used to provide a further patterned mask over the device, through which p-type dopant atoms are implanted in order to provide p+ source and drain regions.

Deposit Oxide/Nitride Stack

Figure 3K:
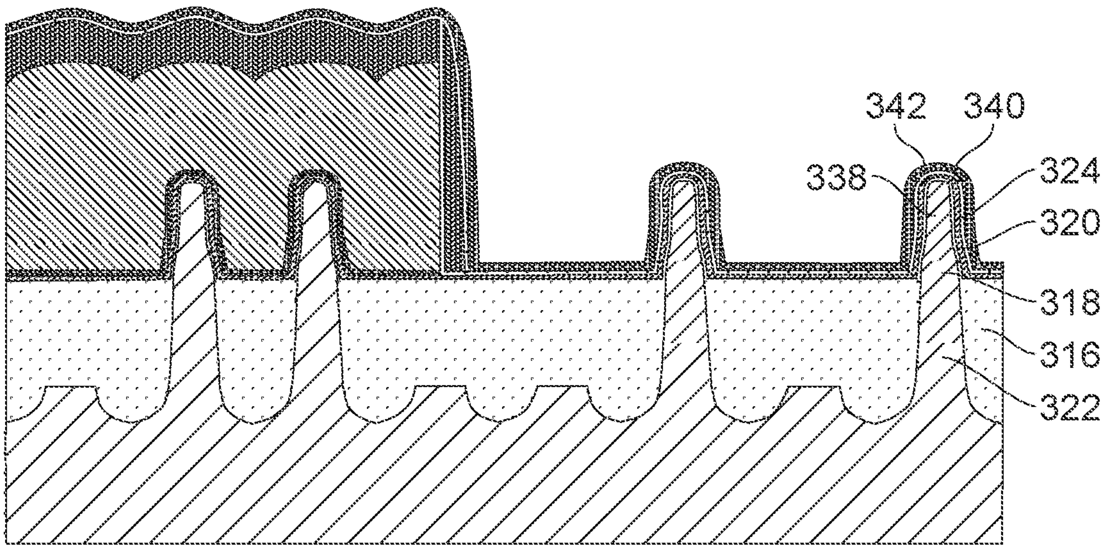

In a next stage of the process, a further stack of oxide 340 and nitride 342 layers are deposited over the device. FIG. 3K shows a schematic cross-section through a finFET device according to embodiments of the present disclosure, after these steps of the manufacturing process.

Pattern P-Type Source-Drain Epitaxial Silicon Growth Mask

Figure 3L:
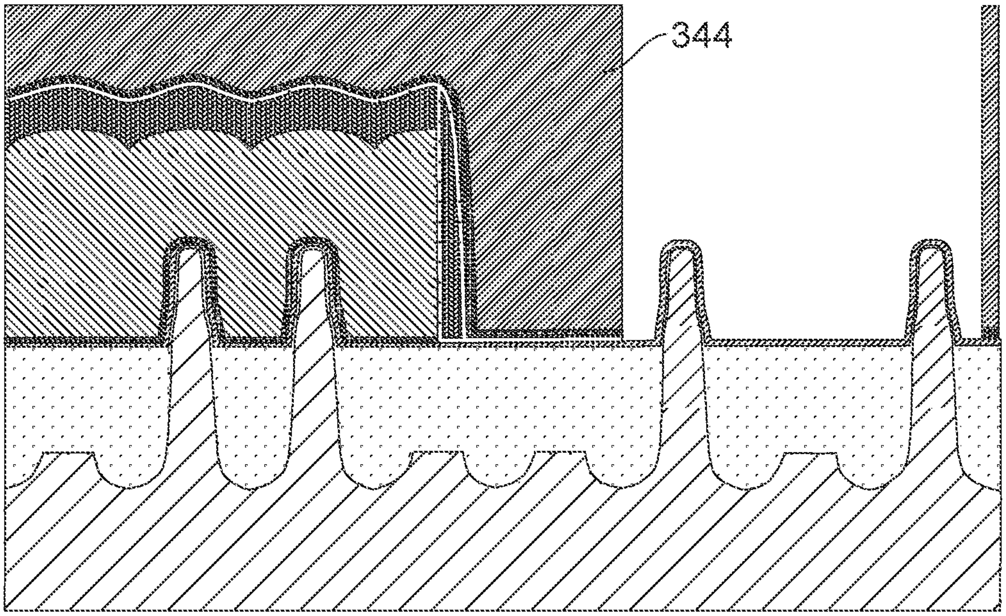

In a next stage of the process, a further etch mask 344 is provided over the silicon fins, and the source-drain epitaxial growth regions. It should be noted that the mask exposes the area which will eventually contain the metal heat sinking trench, which is particularly relevant to the present disclosure. This mask may conveniently be a soft mask such as the photoresist of the photolithography stage itself. FIG. 3L shows a schematic cross-section through a finFET device according to embodiments of the present disclosure, after these steps of the manufacturing process.

Etch Silicon Fins in P-Type Epitaxial Silicon Growth Openings

In a next stage of the process, a section of the exposed silicon fins in the openings in the P-type epitaxial silicon growth mask are removed by etching. This process stage includes etching the high-k (high permittivity) dielectric layer 324, and oxide layer 320 which protect the fins 338.

Figure 3M:
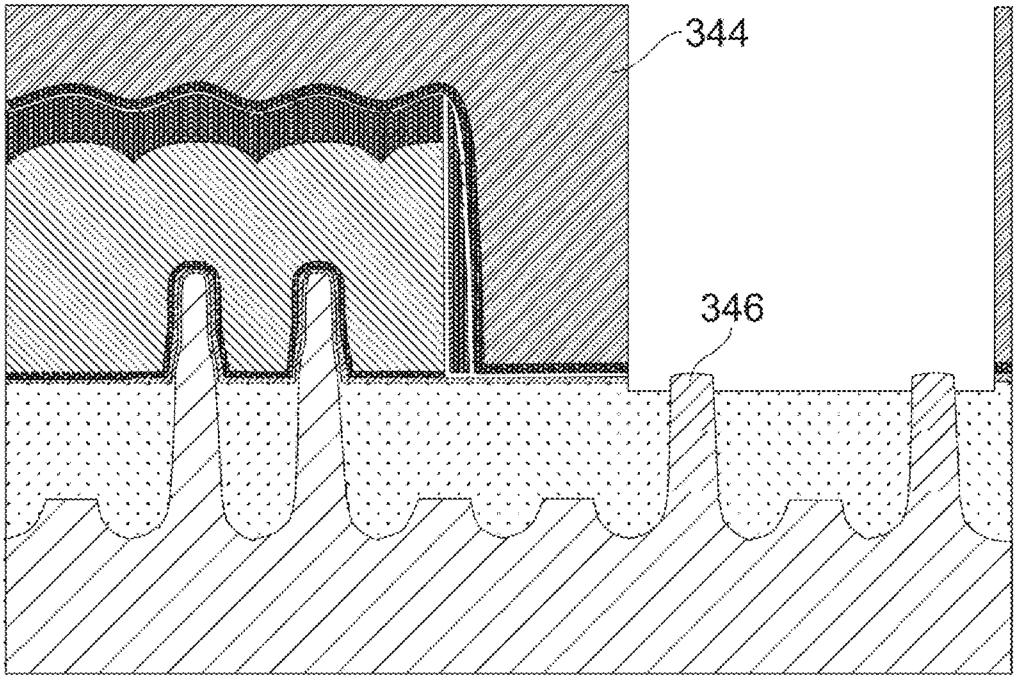

The silicon etch utilized to remove a section of the exposed silicon fins needs to have high selectivity to the field oxide 130. FIG. 3M shows a schematic cross-section through a finFET device according to embodiments of the present disclosure, after these steps of the 'conventional' manufacturing process.

Etch Oxide in P-Type Epitaxial Silicon Grown Openings

Figure 3N:
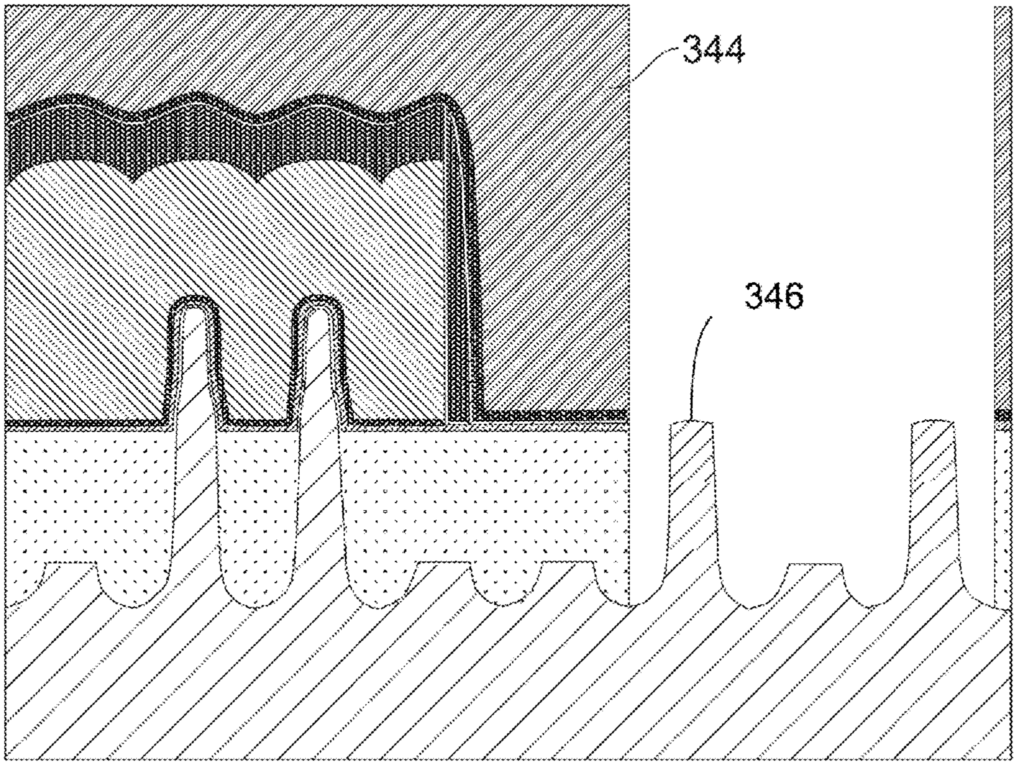

A step which is absent in the conventional process and is included in this present disclosure, is the etching of the field oxide 130 to expose the silicon fin sidewalls and the substrate silicon, and in a next stage of the process according to the present disclosure, the field oxide between and around the stumps remaining from the removed silicon fins 346 is removed by etching. FIG. 3N shows a schematic cross-section through a finFET device according to embodiments of the present disclosure, after these steps of the manufacturing process.

Remove Etch Mask

In a next stage of the process, the etch mask 344 is removed.

Grown P-Type Doped SiGe Epitaxial Growth on Exposed Silicon Surfaces

In a next stage of the process, P-type doped SiGe is epitaxially grown on to the exposed silicon surfaces. It will be appreciated that this process step is also present in the conventional process. The epitaxial SiGe 348 grows on the exposed surfaces of the silicon. This epitaxial material fills the gap between the stump 346 and the un-etched oxide 316. In other embodiments, silicon may be grown in place of the SiGe.

Remove P-Type Source-Drain Epitaxial Silicon Growth Mask

In a next stage of the process, the sections of oxide 340 and nitride 342 layers patterned using mask 344 are removed.

N-Type Source-Drain Epitaxial Silicon Growth Steps

Figure 3O:
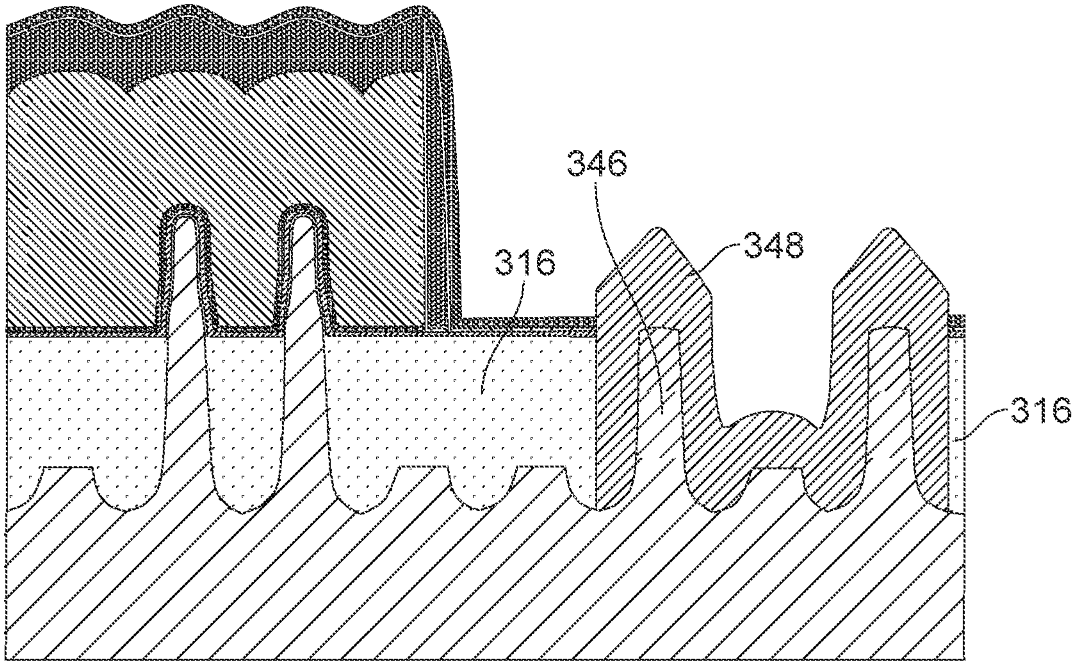

In a next stage of the process, the P-type epitaxial silicon growth steps described above are repeated but this time for N-type epitaxial Silicon growth. During the N-type version of these process steps, the P-type fins with P-type SiGe grown on the tops and sides of the partially etched silicon fins 346 as well as the exposed regions of substrate silicon, will be protected with an oxide 340 and nitride 342 hard mask which will only expose the N-type silicon fins at which substrate trench contacts are desired. Thus, during the N-type version of these process steps, the N-doped epitaxial silicon growth will only be on the N-type partially etched silicon fins 346 as well as the exposed regions of substrate silicon. FIG. 3O shows a schematic cross-section through a finFET device according to embodiments of the present disclosure, after these steps of the manufacturing process, relating to P-type silicon fins.

Dopant Activation Anneal

In a next stage of process, the device is thermally treated using a conventional annealing process, in order to activate the implanted dopant in the silicon material.

Deposit Thin Metal Film

In a next stage of the process, a thin metal film (which is typical of the of the order of a few tens of nanometres) is deposited over the complete device. As will be appreciated from the next step, this metal will form source and drain silicidation, and typically comprises a one of titanium and cobalt.

First Anneal to Form Metal Silicide on Exposed Source-Drain Regions.

In a next stage of the process, a thermal treatment, or anneal, is applied to the device at a temperature sufficient to react the metal with exposed epitaxial silicon or SiGe, or SiC 348 grown on the exposed stumps 346, to form a metal silicide 350. The time and temperature of this thermal treatment should generally be sufficient for complete or at least majority silicidation of the deposited metal film.

Remove Unreacted Metal

In a next stage of the process, any unreacted metal (such as that on the exposed oxide or exposed nitride parts of the device) are removed, typically by etching.

Second Anneal to Change Silicide to Stable Phase

Figure 3P:
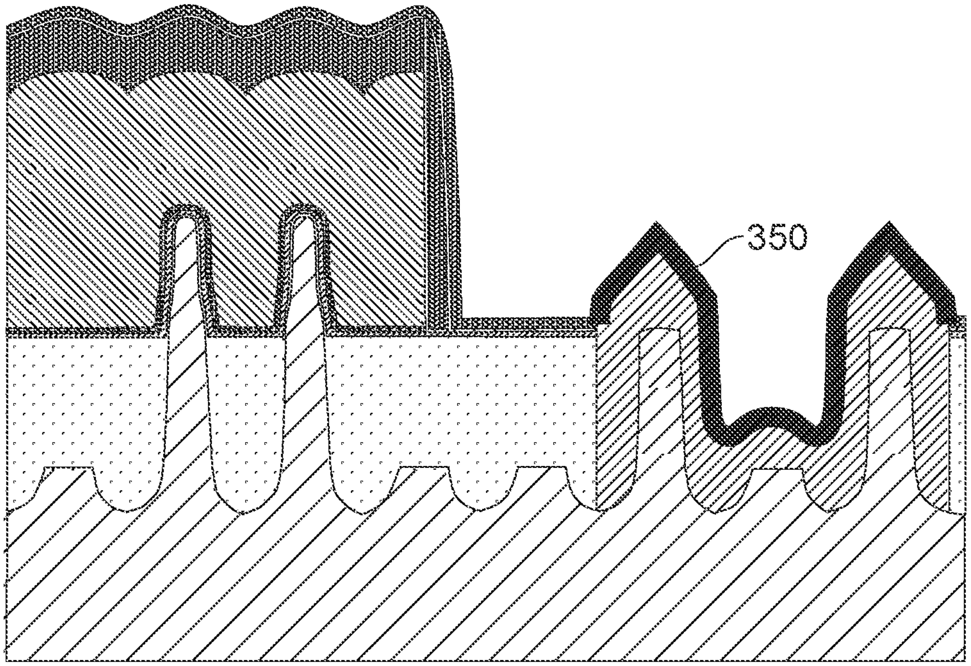

In a next stage of the process, a further thermal treatment or anneal is applied to the device at a temperature and for a time to change the metal silicide 350 from a first phase or a mixed phase to a second phase which is more stable and having lower sheet resistivity, which in turn results in a lower contact resistance between the metal and silicide. FIG. 3P shows a schematic cross-section through a finFET device according to embodiments of the present disclosure, after these steps of the manufacturing process.

Deposit (Initial) Inter-Layer Dielectric

In a next stage of the process, an initial inter-layer dielectric 352, which may also be referred to as inter-layer dielectric "ILD0", is deposited across the device. ILD0 is typically formed from an oxide.

Polish Oxide.

Figure 3Q:
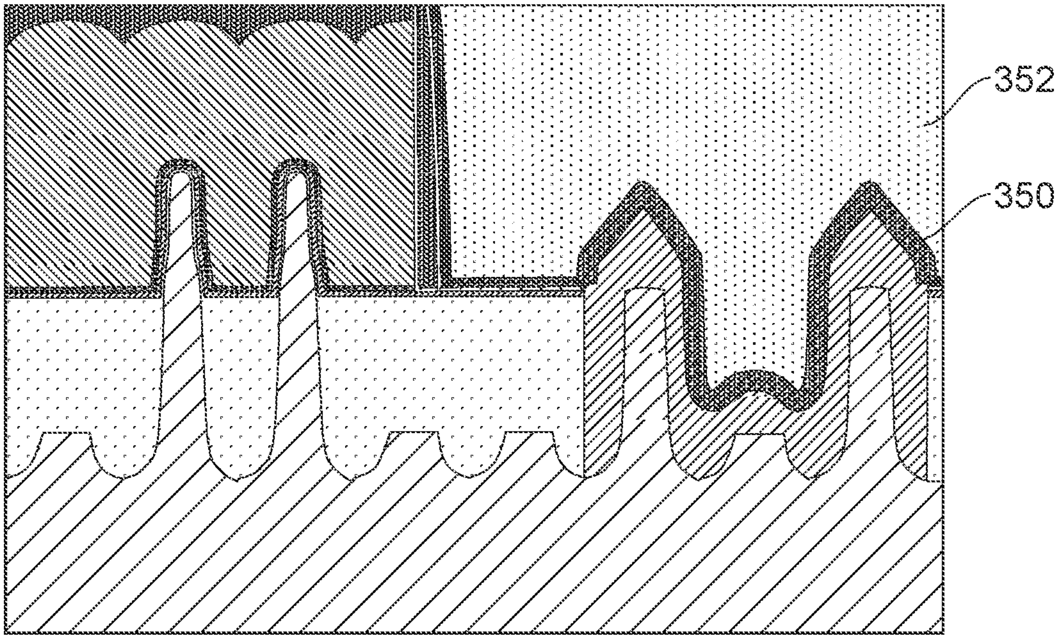

In a next stage of the process, the devices are polished by a chemical mechanical polish (CMP) step to planarise the oxide. As will be familiar to the skilled person, the exposed nitride may conveniently be used as a etch stop for the chemo-mechanical etching process. FIG. 3Q shows a schematic cross-section through a finFET device according to embodiments of the present disclosure, after these steps of the manufacturing process.

Polish Oxide & Polysilicon

Figure 3R:
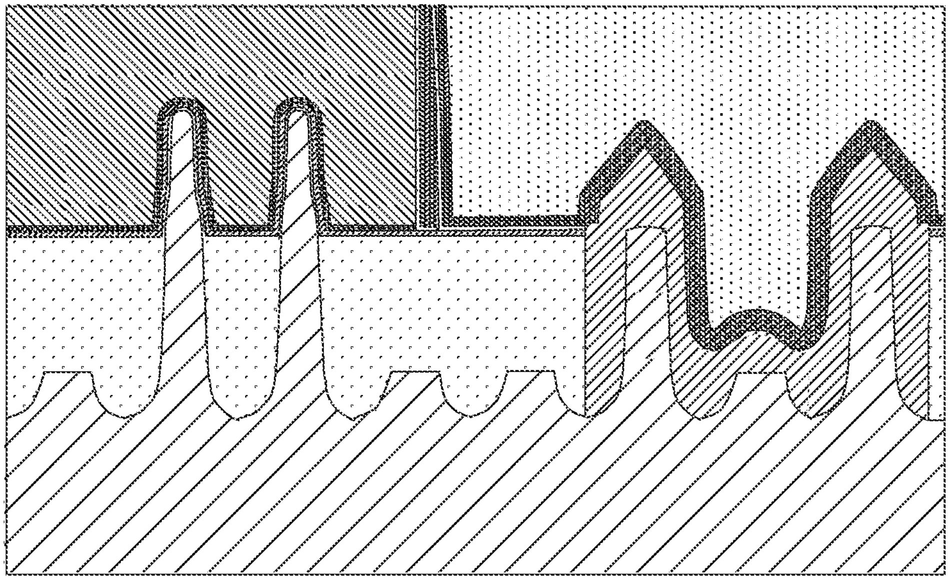

In a next stage of the process, a further polishing typically by chemo-mechanical polishing (CMP) is undertaken to planarise the device. This process removes all the nitride and a limited portion of the polysilicon of the transistor gates. FIG. 3R shows a schematic cross-section through a finFET device according to embodiments of the present disclosure, after these steps of the manufacturing process.

Remove Gate Polysilicon

In a next stage of the process, the poly silicon in the transistor gate is removed.

Deposit N-Type Transistor Work Function (WF) Metal

In a next stage of the process, a metal 354 is deposited across the device. This metal is the work function metal for N-type transistors. This metal defines the threshold voltage (Vt) of the N-type transistors of the device.

Remove Metal

In a next stage of the process, a photolithography defined mask is created to protect the N-type transistor regions. The deposited metal is removed from other regions of the device and specifically removed from P-type transistor regions.

Deposit P-Type Transistor Work Function (WF) Metal

In a next stage of the process, another metal is deposited across the device. This metal is the work function metal for P-type transistors. This metal defines the threshold voltage (Vt) of the P-type transistors of the device.

Remove Metal

Figure 3S:
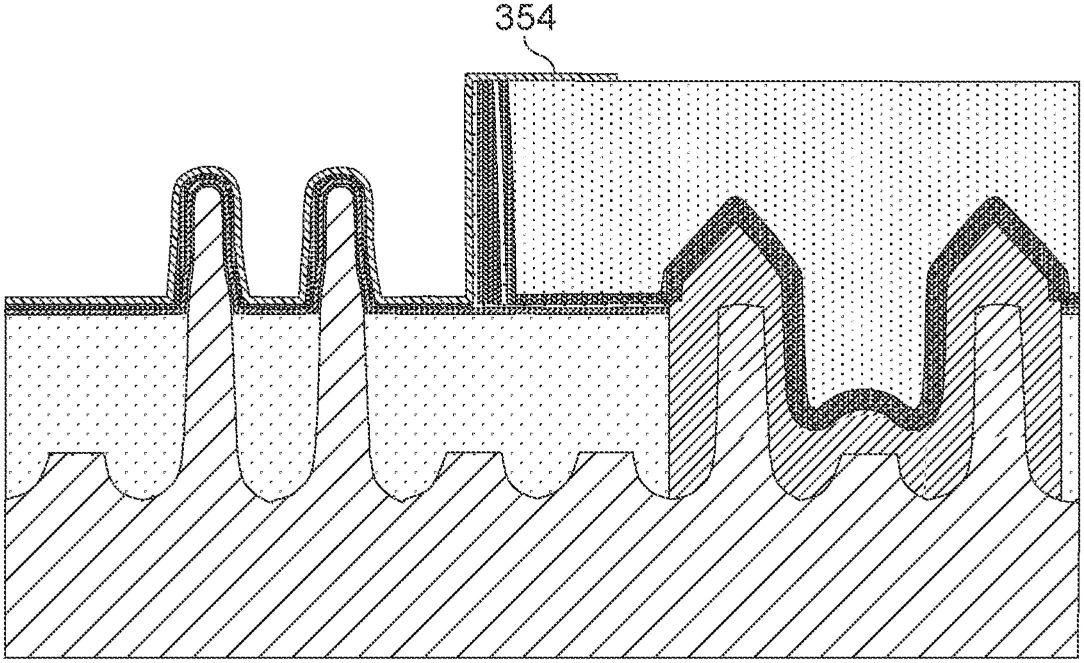

In a next stage of the process, a photolithography defined mask is created to protect the P-type transistor regions, The deposited metal is removed from other regions of the device and specifically removed from N-type Transistor regions. FIG. 3S shows a schematic cross-section through a finFET device according to embodiments of the present disclosure, after these steps of the manufacturing process.

Deposit Gate Electrode Metal

In a next stage of the process, gate electrode metal 356 is deposited across the device.

Polish Gate Electrode Metal

Figure 3T:
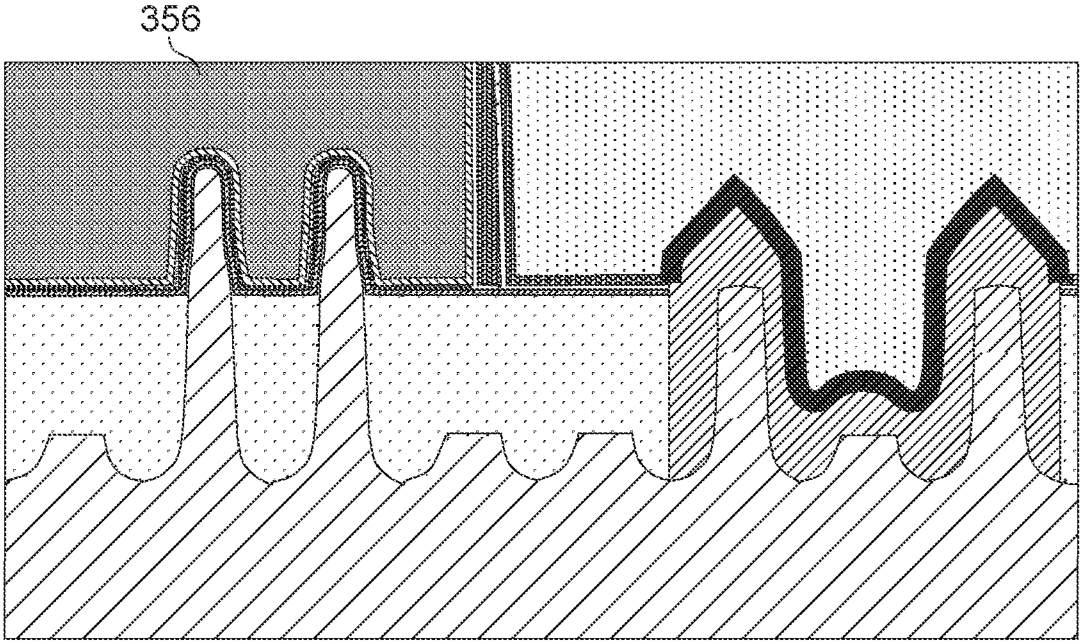

In a next stage of the process, the device is polished, typically by CMP, to remove gate electrode metal 356 from unwanted areas. The interlayer dielectric 0, ILD0, may conveniently be used as a polish stop layer for this process. FIG. 3T shows a schematic cross-section through a finFET device according to embodiments of the present disclosure, after these steps of the manufacturing process. The device shown is a N-type transistor Gate with a P-type substrate contact, and it will be appreciated that elsewhere on the wafer or circuit, P-type transistor gates with a N-type substrate contacts are also fabricated.

Deposit Inter-Layer Dielectric "1" (ILD1)

In a next stage of the process, the next interlayer dielectric (ILD1) 358 is deposited across the entire device.

Polish Oxide to Planarize Wafer Surface

Figure 3U:
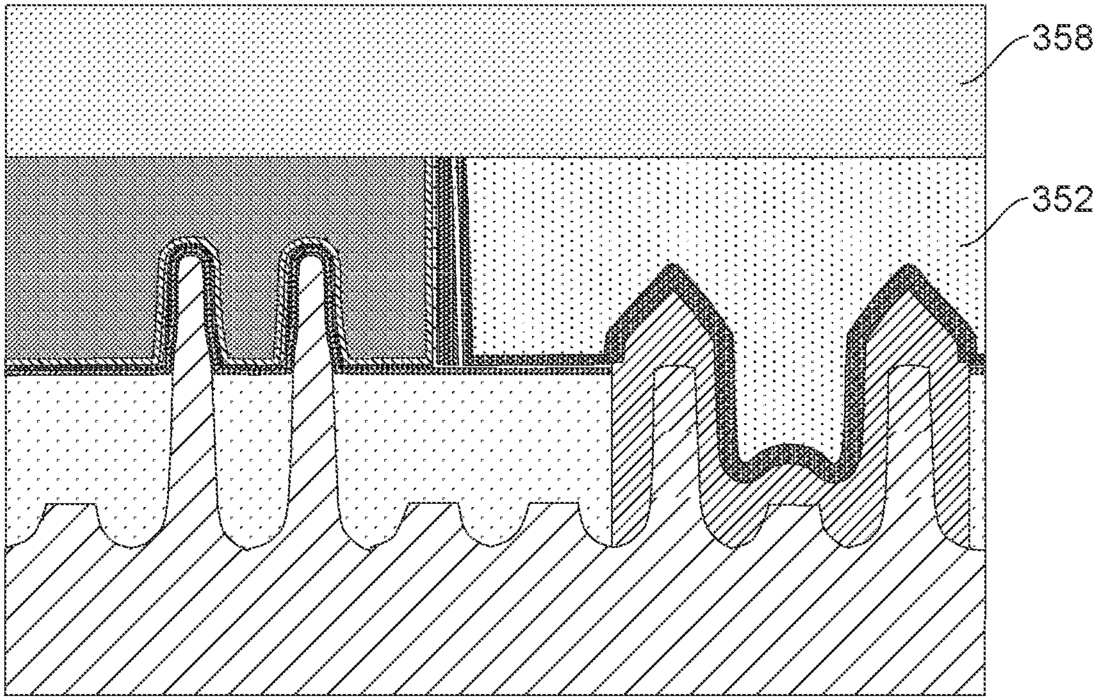

In a next stage of the process, the oxide of ILD1 is polished, typically by CMP, in order to planarise the wafer surface. FIG. 3U shows a schematic cross-section through a finFET device according to embodiments of the present disclosure, after these steps of the manufacturing process.

Etch Gate Connection Trench Contacts (GT)

Figure 3V:
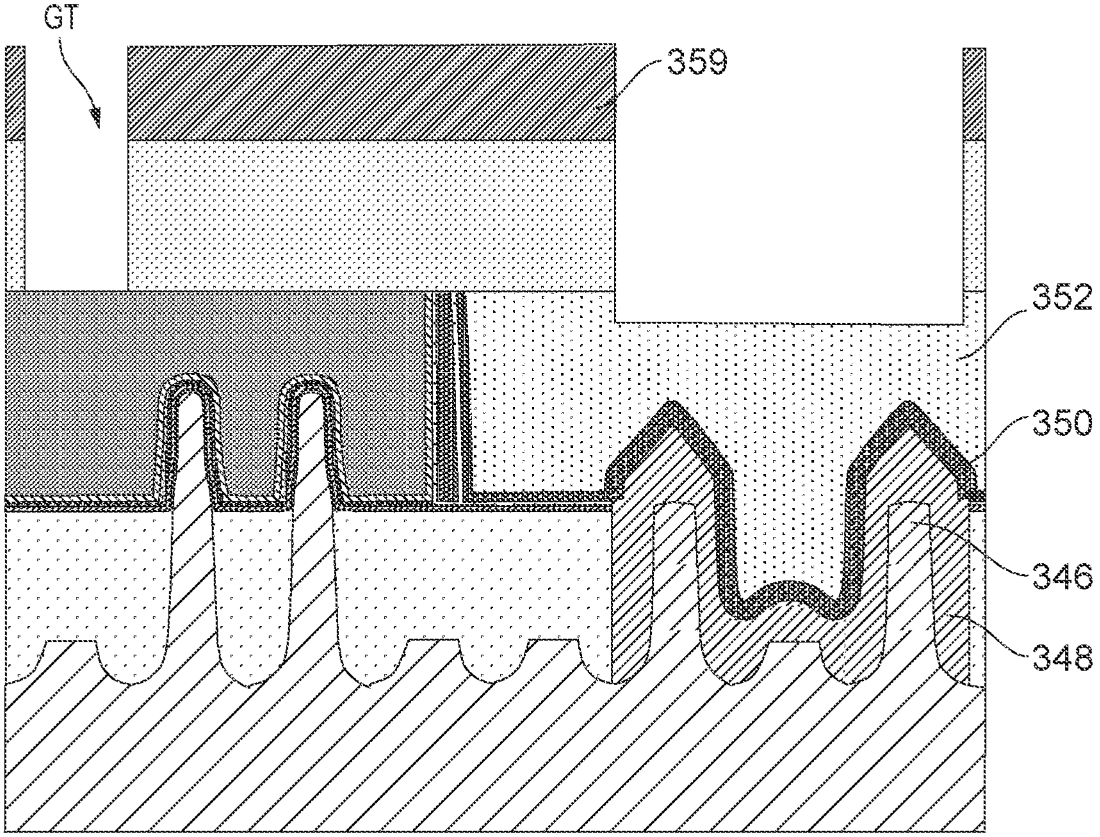

In a next stage of the process, a mask 359 is defined across the device and the ILD1 layer 358 is etched through the mask to provide a gate connection trench (GT). In contradistinction to the conventional process, for embodiments of the present disclosure, the ILD1 layer 358 is etched remotely from the gate over the SiGe covered by metal silicide 350. It will be appreciated, that the ILD0 layer 352 may be slightly etched, in order to ensure complete removal of the ILD1 layer 358 in the Gate connection trench. FIG. 3V shows a schematic cross-section through a finFET device according to embodiments of the present disclosure, after these steps of the manufacturing process.

Remove Gate Connection Trench Etch Mask

In a next stage of the process, the etch mask used to define the gate connection trench is removed.

Etch Source-Drain Connection Trench Contacts (DT)

Figure 3W:
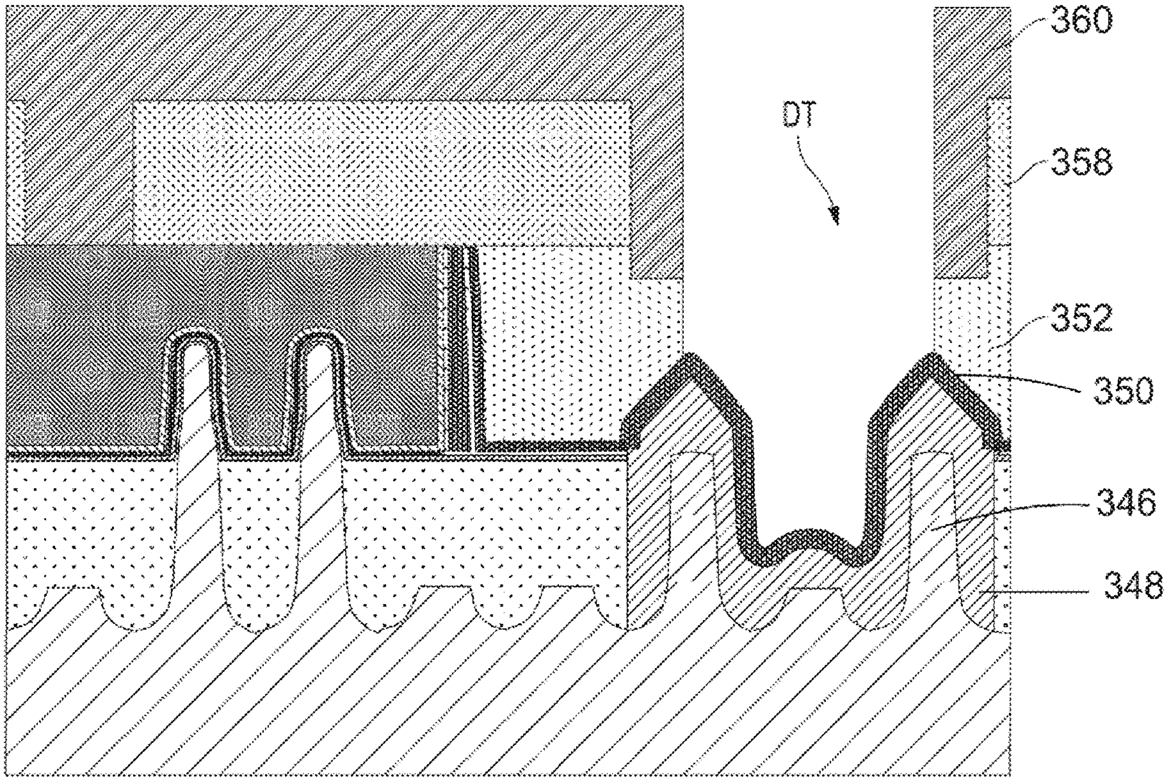

In a next stage of the process, a further mask (360) is defined across the wafer to expose the regions where epitaxial silicon or SiGe or SiC and subsequent metal silicide was formed on partially etched silicon fin tops, silicon fin sidewalls and substrate silicon surfaces. These regions may also referred to as diffusion contact trenches (DT). In contradistinction from the conventional process, according to process flows in to one or more embodiments of the present disclosure, this mask also leaves exposed a region above and between the stumps 346 along with the overlying SiGe 348 and metal silicide 350. It will be noted that the exposed region at the start of the device is narrower than that exposed for the etching of the ILD1 layer 358. The layer ILD0 352 is removed from the diffusion contact. During this etching of ILD zero layer 352, it is also removed from the metal silicide 350 and SiGe 348 above and between the stumps 346. It will be appreciated that, since the gate-trench etch and the diffusion contact trench etch, in conventional processes, include an amount of over-etching to ensure complete removal of the oxide of the ILD0 oxide, the trench-to-substrate according to the present disclosure can be achieved with essentially no, or little, adaptation of the conventional etching steps. FIG. 3W shows a schematic cross-section through a finFET device according to embodiments of the present disclosure, after these steps of the manufacturing process.

Figure 9A:
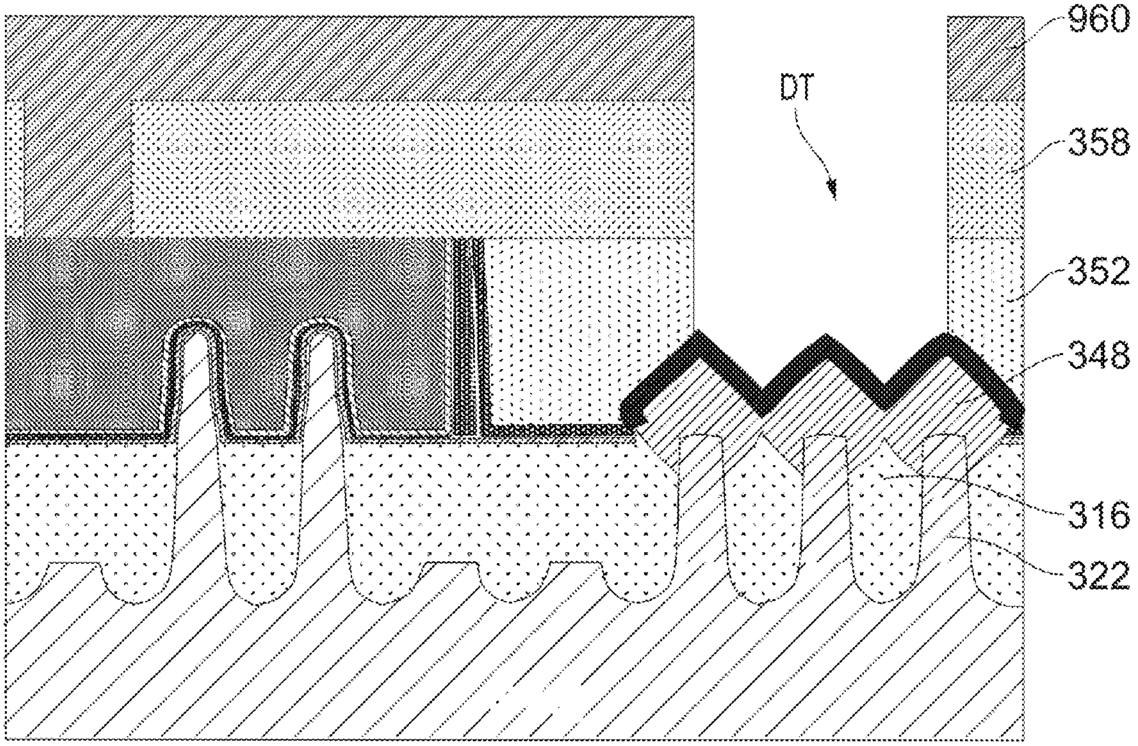
FIG. 9A (PRIOR ART)
FIG. 9A shows a schematic cross-section through a conventional finFET device, at a corresponding stage to FIG. 3W.

Turning for the moment to FIG. 9A, this shows a schematic cross-section through a conventional finFET device, at a corresponding stage to FIG. 3W, and after corresponding steps of the manufacturing process. The device is generally similar to that shown in FIG. 3W. However, in the conventional part-processed device shown, the epitaxial SiGe 348 which is grown on to the exposed stumps 346, coalesces into a single, contiguous region.

Also, there has not been a prior etching in the region of the source-drain trench (DT), during the Gate connection trench etching step ("GT") shown at FIG. 3V. The later lithography mask 960, which corresponds to mask 360 in FIG. 3W, thus does not include a stepped region around DT, since ILD1 layer 358 was not previously etched in this region. In other words, the etch step following deposition of the mask 360 is the first etching of ILD1 358 in this region.

We now return to the process description of a method according to embodiments of the present disclosure.

Remove "DT" Etch Mask

In a next stage of the process, the source-drain trench (DT) etch mask is removed.

Deposit 'Seed' Metal Layer

In a next stage of the process, a seed metal layer 362 is deposited across the device. The seed metal layer may for instance be formed of ruthenium, or tantalum or titanium and their nitrides. The seed metal layer will may conveniently be a thin layer having a thickness for example in a range of 3 to 20 nm.

Deposit Trench Contact Metal

In a next stage of the process, the trench metal contact 364 is deposited across the device. The trench metal contact 364 may typically be formed of copper, tungsten or cobalt. The skilled person will appreciate that in a conventional device, the trench metal contact needs to fill all of the exposed trenches, which generally only go as deep as the depth of ILD1 358. However, according to embodiments of the present disclosure the trench metal fills not only the trench in ILD1 layer 360 but also the trench in ILD0 layer 352 and the spaces between the stumps 346. Thus the thickness of the trench metal which is deposited may be considerably more than that for a conventional device.

Polish Metal

In a next stage of the process, the trench metal 364 is polished, typically by using a CMP process. The ILD one layer 358 may conveniently be used as a polish stop layer. FIG. 3X shows a schematic cross-section through a finFET device according to embodiments of the present disclosure, after these steps of the manufacturing process.

Further Process Steps

Further process steps of the device follow conventional processes for subsequent ILD and metal layers as will be familiar to the skilled person.

Figure 3X:
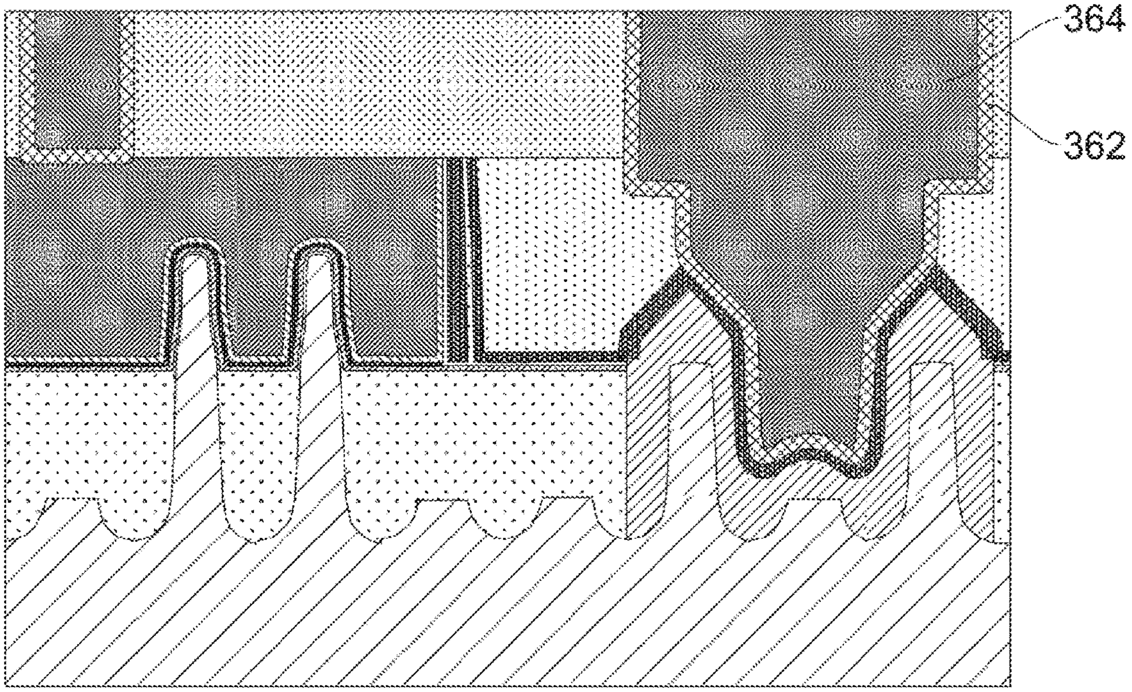
Figure 9B:
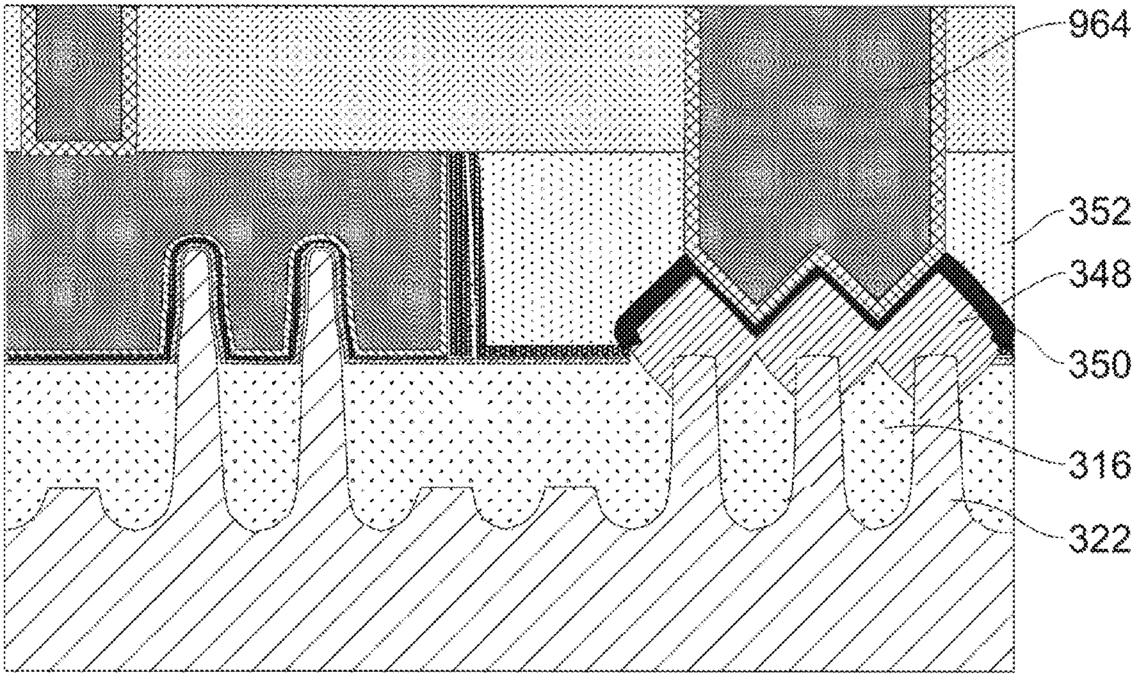
FIG. 9B (PRIOR ART)
FIG. 9B shows a schematic cross-section through a conventional finFET device at the same stage of manufacture as FIG. 3X.

Turning now to FIG. 9B, this shows a schematic cross-section through a conventional finFET device at the same stage of manufacture as does FIG. 3X for embodiments of the disclosure. Comparing FIG. 9B to FIG. 3X, it is apparent that in the conventional device, the trench metal, depicted as 964 in FIG. 9B goes no deeper into the device than ILD0 352. It is in contact with the epitaxial SiGe through the silicide surface region 350, but, this is much shallower in the device, compared with embodiments of the disclosure. Moreover, in the conventional device shown, the field oxide 316, which is a thermal insulator as well as an electrical insulator, lies between the trench metal 964 and the substrate. The main thermal conduction path from the trench metal 964 to the substrate is through the epitaxial SiGe 348, which has been silicidated, and thence through the partial fins (322) which are separated by the field oxide regions 316.

Figure 10A:
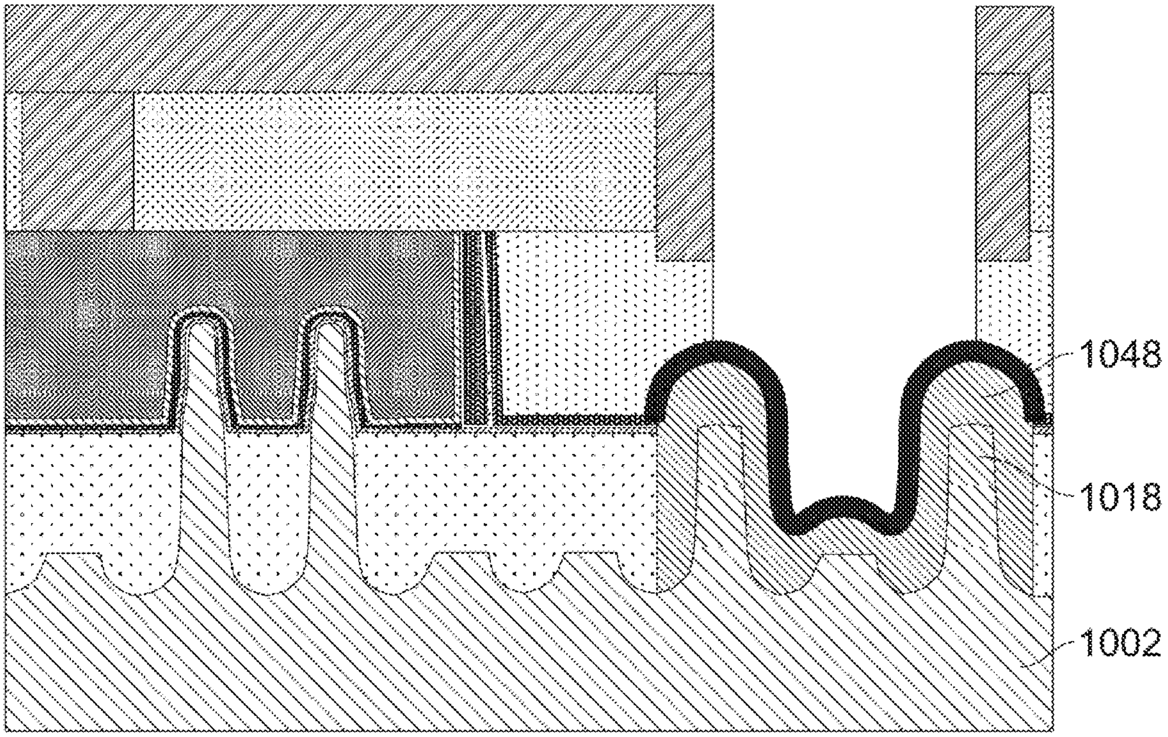
FIG. 10A shows a schematic cross-section through a finFET device, according to one or more other embodiments of the present disclosure.
Figure 10B:
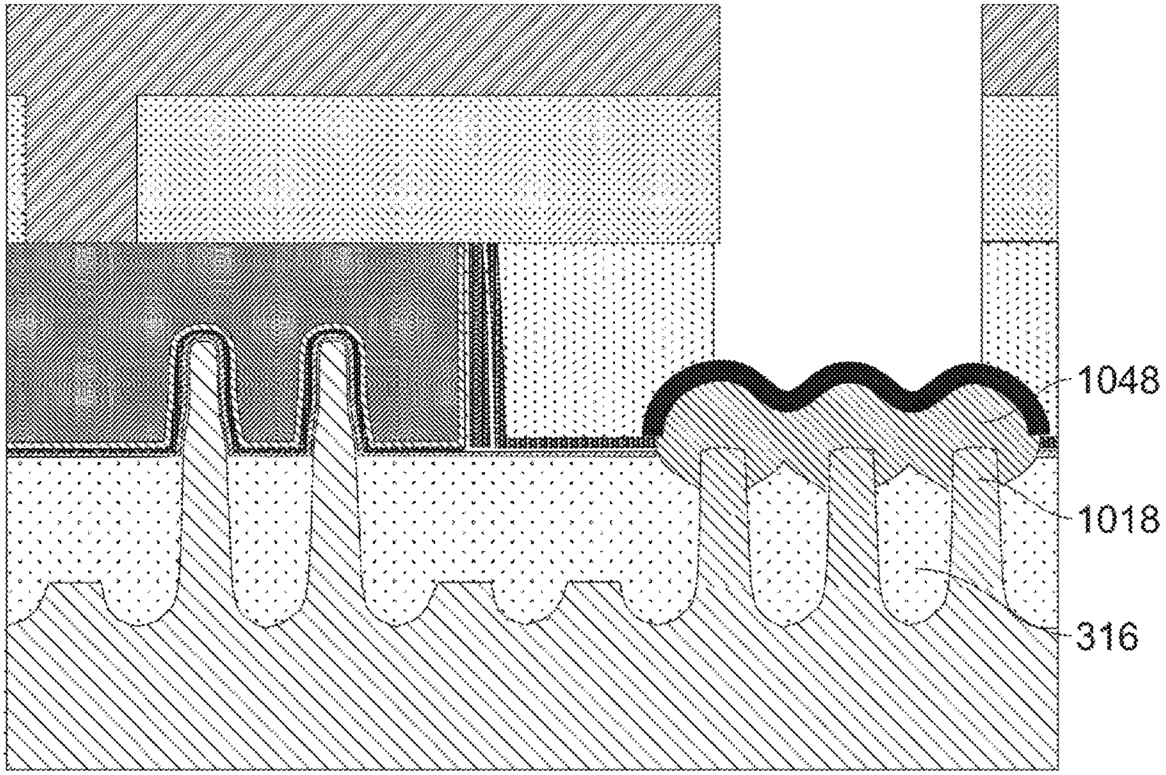
FIG. 10B (PRIOR ART)
FIG. 10B shows a schematic cross-section through a conventional finFET It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar features in modified and different embodiments.

FIG. 10A shows a schematic cross-section through a finFET device, according to one or more other embodiments of the present disclosure, and FIG. 10B shows a schematic cross-section through a conventional finFET. These figures show the manufacturing at a stage corresponding to FIG. 3W, and FIG. 9A, and after corresponding steps of the manufacturing process.

The primary difference between FIG. 10A and FIG. 3W, is that FIG. 10A depicts a part-processed device in an N-well 1002, whereas FIG. 3W depicts a part-processed device in a P-well 302. In FIG. 10A (embodiments of the disclosure), and FIG. 10B (which depicts a corresponding conventional device), the fins are thus N-type. The upper parts 1018 of the partial fins are implanted to be heavily N-type. Moreover, the devices in N-wells (both embodiment of the disclosure shown in FIG. 10A, and conventional devices shown in FIG. 10B), have epitaxial Silicon (rather than Si-Ge), grown onto the exposed tips of the upper parts 1018 of the partial fins. It will be observed that the epitaxial silicon does not form such a pronounced "angular" shape at the tips (that is to say, preferential growth along on specific crystallographic surfaces is less pronounced, for n-type Silicon 1048, than it is for P-type SiGe 348.

As just mentioned, FIG. 10B shows a conventional device in an N-well. Again, in this conventional part-processed device shown, the epitaxial Si 1048 which is grown on to the exposed stumps 346, coalesces into a single, contiguous region, and separates the subsequently deposited trench metal from the partial fins 1018. The partial fins are separated by field oxide 316, which is what is stated above, is a thermal insulator. Thus the primary thermal conduction in the completed device is through the epitaxial silicon 1048 and the partial fins 1018, which provides a much lower thermal conductance path than is provided by embodiments of the present disclosure in which the field oxide in this region is replaced by additional trench metal.

Figure 4:
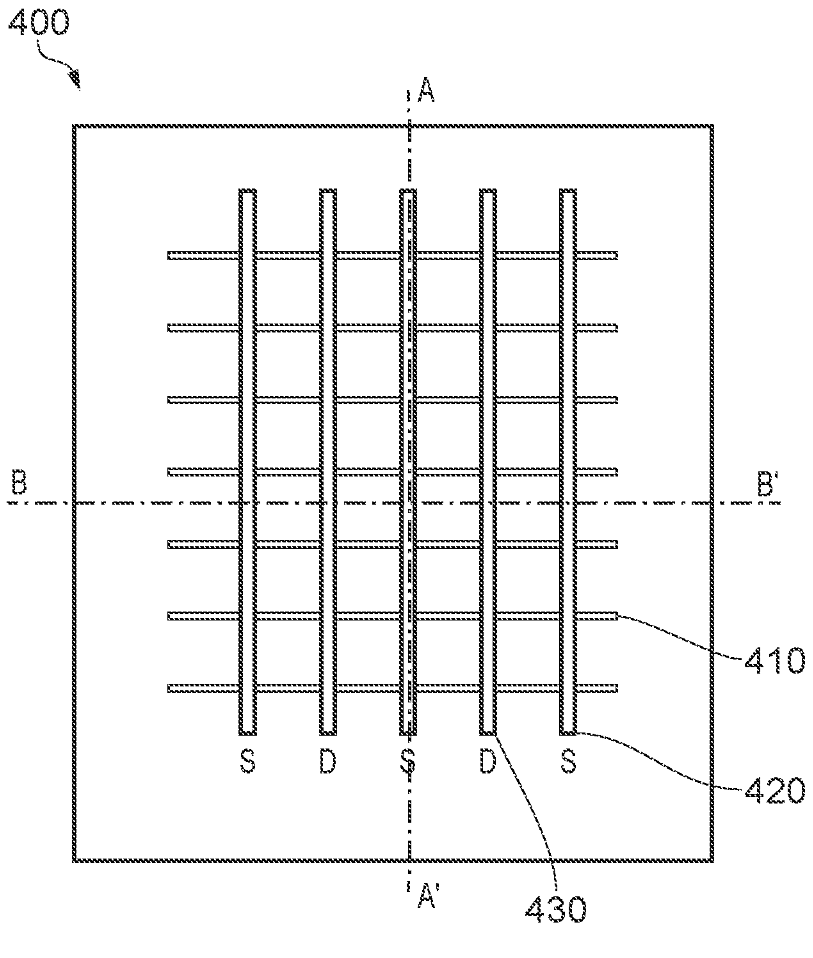
FIG. 4, shows a schematic of part of a partially manufactured finFET.

Turning now to FIG. 4, this shows a schematic of part of a partially manufactured finFET 400. FinFET 400 includes a plurality of elongate fins 410 as described above. The elongate fins are intersected by, as shown, a plurality of interleaved source fingers S 420 and drain fingers D 430. FIG. 4 is stylised in that the source fingers 420 and drain fingers 430 are shown, which correspond to metal in typically layer M1 and M2 of the metal layer stack. However, between each source and drain finger is a gate finger (not shown) which also crosses the fins as will be more evident from FIG. 5 through FIG. 8, the gate fingers are visible at the surface of the device, but not at the M0 or M2 metal layers and so are not shown in FIG. 4.

Figure 5:
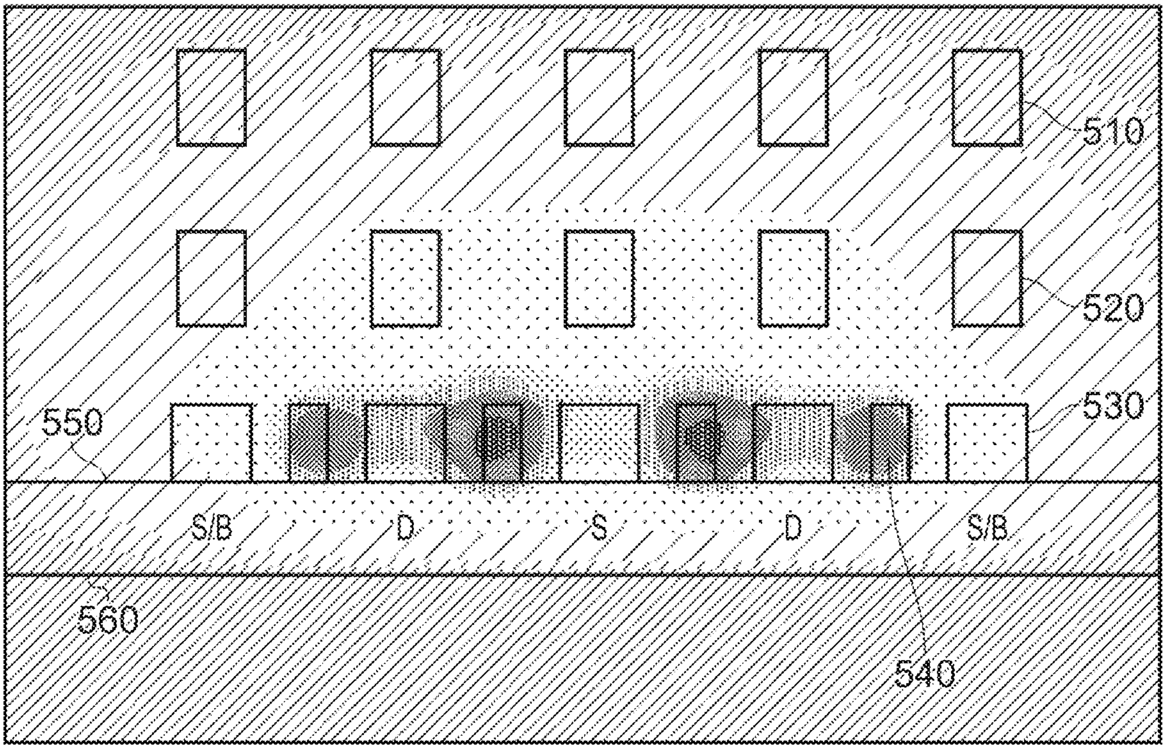
FIG. 5 (PRIOR ART)
FIG. 5 shows a cross-section through B-B' of FIG. 4 for a conventional finFET.
Figure 6:
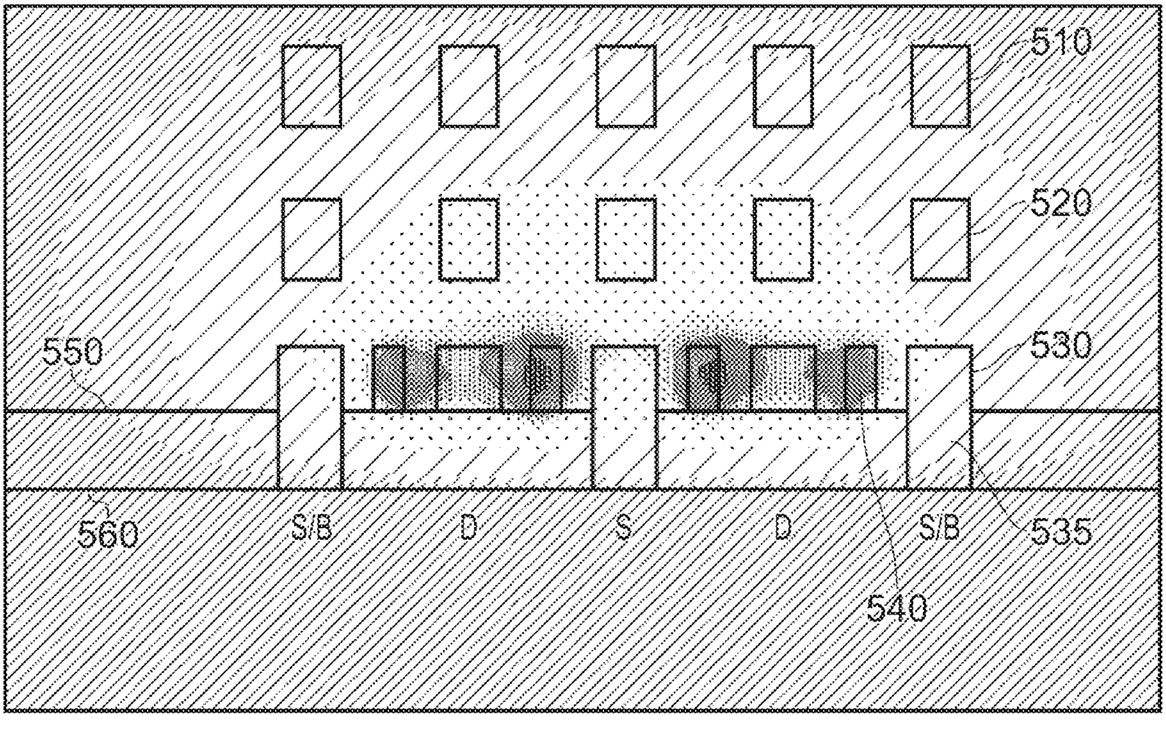
FIG. 6 shows a cross-section through B-B' of FIG. 4 for a finFET according to one or more embodiments of the present disclosure.

FIG. 5 shows a cross-section through B-B' of FIG. 4 for a conventional finFET. FIG. 6 shows a cross-section through B-B' of FIG. 4 for a finFET according to one or more embodiments of the present disclosure.

Shown in these figures are metal regions 510 of metal layer M2, metal regions 520 of metal layer M1, and metal regions 530 of metal layer M0. The metal regions of each layer are separated and isolated from each other by dielectric, and the layers are separated by the interlayer dielectric ILD. Metal regions 530 are connected to the interleaved, or alternating, source and drain regions. Moreover, at the same level of the device as M0 are shown the gates 540, interleaved between the alternating source and drain fingers. Moreover, in FIG. 6 the metal connection S/B to substrate 535 are shown on the outermost regions. The heat-sinking metal connections to substrate connect the body regions to the substrate, according to embodiments of the disclosure and as described in detail in FIGS. 3A-3X. The upper and lower surfaces of the field oxide are shown at 550 and 560 respectively.

Isotherms corresponding to an example set of operating conditions are indicated by the various shading in the figures. It is clear from the figure, that the hottest parts of the device are around and close to the gate. Comparing the isotherms shown in FIG. 5 with those in FIG. 6, it is apparent that the isotherms are slightly smaller in FIG. 6, which corresponds to embodiments of the disclosure, and which is indicative of more efficient cooling and that the structure of FIG. 6 operates at a cooler temperature (typically between 10 and 20 K lower).

Figure 7:
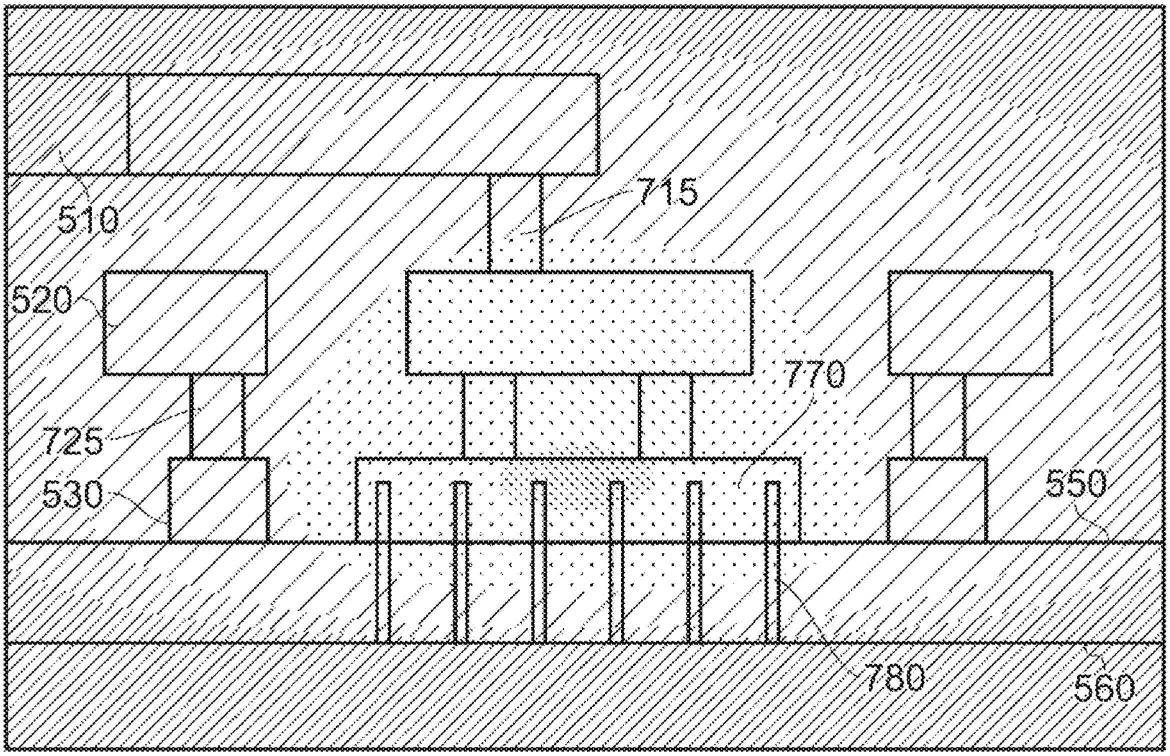
FIG. 7 (PRIOR ART)
FIG. 7 shows a cross-section through A-A' of FIG. 4 for a conventional finFET.
Figure 8:
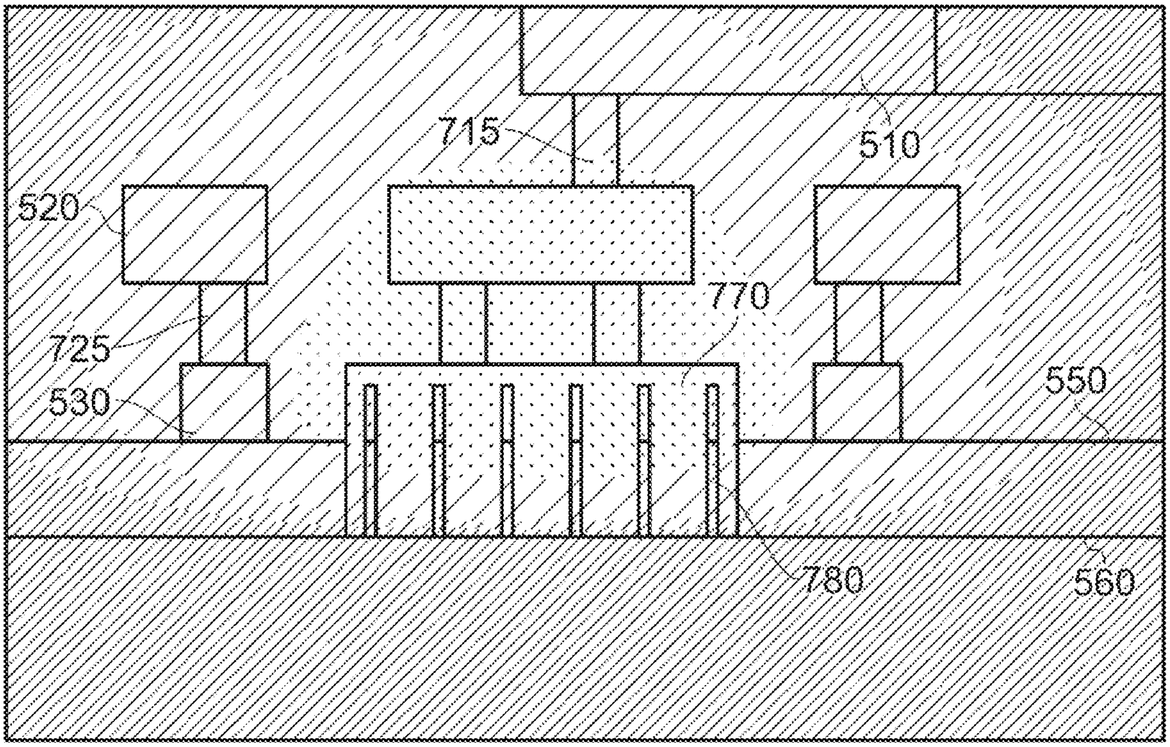
FIG. 8 shows a cross-section through A-A' of FIG. 4 for a finFET according to one or more embodiments of the present disclosure.

FIG. 7 shows a cross-section through A-A' of FIG. 4 for a conventional finFET. FIG. 8 shows a cross-section through A-A' of FIG. 4 for a finFET according to one or more embodiments of the present disclosure. In addition to metal layer M2 510, metal layer M1 520, and metal layer M0 530 are shown vias 715 and 725 through the ILDs. Also shown is a gate 770, which partially surrounds an upper portion of fins 780. The fins extend through the field oxide (extent of which is not shown laterally) between surfaces 550 and 560 and protrude thereabove such that the upper portion is partially surrounded by the gate 770. It will be appreciated that in this cross-section, the heat sinking metal connections to substrate are not visible.

Again comparing the isotherms, which correspond to the same operating conditions in each figure, it is evident that the isotherms are smaller, and in this case there is at least one fewer isotherm, in FIG. 8 according to embodiments of the present disclosure, compared with the conventional device shown at FIG. 7. This corresponds to a reduced operating temperature of the device according to embodiments in FIG. 8, compared with that of the conventional device in FIG. 7.

From reading the present disclosure, other variations and modifications will be apparent to the skilled person. Such variations and modifications may involve equivalent and other features which are already known in the art of finFET fabrication, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

It is noted that one or more embodiments above have been described with reference to different subject-matters. In particular, some embodiments may have been described with reference to method-type claims whereas other embodiments may have been described with reference to apparatus-type claims. However, a person skilled in the art will gather from the above that, unless otherwise indicated, in addition to any combination of features belonging to one type of subject-matter also any combination of features relating to different subject-matters, in particular a combination of features of the method-type claims and features of the apparatus-type claims, is considered to be disclosed with this document.

Features which are described in the context of separate embodiments may also be provided in combination in a single embodiment. Conversely, various features which are, for brevity, described in the context of a single embodiment, may also be provided separately or in any suitable sub-combination.

For the sake of completeness it is also stated that the term "comprising" does not exclude other elements or steps, the term "a" or "an" does not exclude a plurality, a single processor or other unit may fulfill the functions of several means recited in the claims and reference signs in the claims shall not be construed as limiting the scope of the claims. Furthermore, the word "may" is used in a permissive sense (i.e., meaning having the potential to), rather than the mandatory sense (i.e., meaning must). Similarly, the words "include," "including," and "includes" mean including, but not limited to.

What is claimed is:

1. A finFET semiconductor device, comprising:

a substrate having therein a body-region of a first conductivity type, a plurality of elongate fins at a first major surface of the substrate and within the body-region;

an oxide layer on the first major surface and partially surrounding a lower portion of the elongate fins;

a gate region comprising a gate contact extending across and partially surrounding an upper portion of the plurality of elongate fins;

a dielectric material, between the elongate fins and the gate region and providing galvanic isolation therebetween;

a plurality of elongate partial fins, parallel to the plurality of elongate fins, and having a height which is less than a height of the plurality of elongate fins; and an elongate metal contact, extending into the substrate and in electrical contact with the plurality of elongate partial fins, and forming a body-contact for the finFET;

wherein the elongate metal contact extends between a two of the plurality of elongate partial fins and below an upper surface thereof and fills a space therebetween.

2. The finFET semiconductor device according to claim 1, further comprising at least one elongate stump between the two of the plurality of elongate partial fins;

wherein the elongate metal contact extends between the two of the plurality of elongate partial fins to the at least one elongate stump.

3. The finFET semiconductor device according to claim 1, wherein a surface of the plurality of elongate partial fins, and a surface of the at least one elongate stump comprises a metal silicide.

4. The finFET semiconductor device according to claim 1, wherein the elongate metal contact comprises a first seed metal in contact with metal silicide and a second metal filling a remainder of the elongate metal contact, wherein the metal silicide is formed on surfaces of the plurality of elongate partial fins.

5. The finFET semiconductor device according to claim 4, wherein the body-region has a first conductivity type, further comprising an elongate drain region, of a second conductivity type opposite the first conductivity type, extending across and in electrical connection with the plurality of elongate fins.

6. The finFET semiconductor device according to claim 5, wherein the finFET comprises a plurality of drain regions, a plurality of source regions, and a plurality of gate contacts arranged in a repeating drain-gate-source-gate sequence.

7. The finFET semiconductor device according to claim 6, wherein the elongate metal contact is adjacent but spaced apart from an outermost one of the sequence.

8. The finFET semiconductor device according to claim 1 in which the body-region has a first conductivity type, further comprising an elongate source region, of a second conductivity type opposite the first conductivity type, extending across and in electrical connection with the plurality of elongate fins.

9. The finFET semiconductor device according to claim 1, further comprising a stack of metal connection layers, having interlayer dielectric layers therebetween, wherein the elongate metal contact extends upwardly through a lowermost two of the interlayer dielectric layers.

10. The finFET semiconductor device according to claim 1, wherein the body-contact for the finFET is electrically connected to a source of the finFET, and the elongate metal contact forms a source contact for the finFET.

11. A method of manufacturing a finFET device, the method comprising:

providing a substrate having therein a body-region of a first conductivity type, and having a plurality of elongate fins at a first major surface of the substrate and within the body-region;

providing an oxide on the first major surface and partially surrounding a lower portion of the elongate fins;

providing a dielectric material on the elongate fins;

providing a gate region comprising a gate contact extending across and partially surrounding the plurality of elongate fins, the dielectric material being between the elongate fins and the gate region and providing galvanic isolation therebetween;

etching a subset of the elongate fins to form a plurality of elongate partial fins, having a height which is less than a height of the plurality of elongate fins, and an upper surface at a same height as an upper surface of the oxide layer;

removing the oxide layer between a two of the plurality of elongate partial fins; and depositing an elongate metal contact, extending into the substrate and in electrical contact with the plurality of elongate partial fins, to form a body-contact for the finFET, wherein the elongate metal contact extends between the two of the plurality of elongate partial fins and below an upper surface thereof and fills a space therebetween.

12. The method of claim 11, further comprising:

etching a subset of the plurality of elongate partial fins between the two of the plurality of elongate partial fins, to form at least one elongate stump; and wherein the elongate metal contact extends between the two of the plurality of elongate partial fins to the at least one elongate stump.

13. The method of claim 11, further comprising:

forming a metal silicide at a surface of the plurality of elongate partial fins, and a surface of the at least one elongate stump.

14. The method of claim 11, further comprising:

depositing the elongate metal contact as a first seed metal in contact with metal silicide and a second metal filling a remainder of the elongate metal contact, wherein the metal silicide is formed on surfaces of the plurality of elongate partial fins.

15. The method of claim 11, further comprising:

forming elongate drain region, of a second conductivity type opposite the first conductivity type, extending across and in electrical connection with the plurality of elongate fins.

16. The method of claim 11, further comprising:

forming an elongate source region, of a second conductivity type opposite the first conductivity type, extending across and in electrical connection with the plurality of elongate fins.

17. The method of claim 16, wherein:

the finFET comprises a plurality of drain regions, a plurality of source regions, and a plurality of gate contacts arranged in a repeating drain-gate-source-gate sequence.

18. The method of claim 16, wherein:

the elongate metal contact is adjacent but spaced apart from an outermost one of the sequence.

19. The method of claim 11, further comprising:

forming a stack of metal connection layers, having interlayer dielectric layers therebetween, wherein the elongate metal contact extends upwardly through a lowermost two of the interlayer dielectric layers.

* * * * *